n(12) United States Patent
Harada et al.

(10) Patent No.: US 6,946,235 B2
(45) Date of Patent: Sep. 20, 2005

(54) POLYMERS, RESIST COMPOSITIONS AND PATTERNING PROCESS

(75) Inventors: Yuji Harada, Niigata-ken (JP); Jun Hatakeyama, Niigata-ken (JP); Yoshio Kawai, Niigata-ken (JP); Masaru Sasago, Hirakata (JP); Masayuki Endo, Kishiwada (JP); Shinji Kishimura, Itami (JP); Kazuhiko Maeda, Tokyo (JP); Michitaka Ootani, Tokyo (JP); Haruhiko Komoriya, Kawagoe (JP)

(73) Assignees: Shin-Etsu Chemical Co., Ltd., Tokyo (JP); Matsushita Electric Industrial Co., Ltd., Kadoma (JP); Central Glass Co., Ltd., Ube (JP)

( * ) Notice: Subject to any disclaimer, the term of this patent is extended or adjusted under 35 U.S.C. 154(b) by 125 days.

(21) Appl. No.: 10/636,692

(22) Filed: Aug. 8, 2003

(65) Prior Publication Data

US 2004/0030079 A1 Feb. 12, 2004

(30) Foreign Application Priority Data

Aug. 9, 2002 (JP) ........................................ 2002-233194

(51) Int. Cl.$^7$ ............................................... G03C 1/492
(52) U.S. Cl. .................... 430/270.1; 430/325; 430/326; 430/905; 430/910; 526/243; 526/244; 526/251; 526/281; 526/287
(58) Field of Search .............................. 430/270.1, 325, 430/326, 905, 910; 526/243, 244, 251, 281, 287

(56) References Cited

U.S. PATENT DOCUMENTS

| 4,491,628 A | 1/1985 | Ito et al. |
| 5,310,619 A | 5/1994 | Crivello et al. |
| 6,576,392 B1 * | 6/2003 | Sato et al. ............... 430/270.1 |

FOREIGN PATENT DOCUMENTS

| JP | 63-27829 A | 2/1988 |
| JP | 2-27660 B2 | 6/1990 |
| JP | 5-158239 A | 6/1993 |
| JP | 5-232706 A | 9/1993 |
| JP | 5-249662 A | 9/1993 |
| JP | 5-249683 A | 9/1993 |
| JP | 5-257282 A | 10/1993 |
| JP | 5-289322 A | 11/1993 |
| JP | 5-289340 A | 11/1993 |
| JP | 06-11837 | * 1/1994 |
| JP | 9-73173 A | 3/1997 |
| JP | 09-197661 | * 7/1997 |
| JP | 9-230595 A | 9/1997 |
| JP | 10-10739 A | 1/1998 |
| JP | 11-327145 A | 11/1999 |
| JP | 11-338150 A | 12/1999 |
| JP | 2000-47385 A | 2/2000 |
| JP | 2000-275841 A | 6/2000 |
| JP | 2000-275838 A | 10/2000 |
| JP | 2000-275840 A | 10/2000 |
| WO | WO 97/33198 A1 | 9/1997 |

OTHER PUBLICATIONS

Shirai et al. Journal of Photopolymer Science and Technology (1998), 11(4), 641–644.*
Fujigaya et al. Journal of Photopolymer Science and Technology (2002), 15(4), 643–654.*

* cited by examiner

*Primary Examiner*—Helen L. Pezzuto
(74) *Attorney, Agent, or Firm*—Birch, Stewart, Kolasch & Birch, LLP

(57) ABSTRACT

A resist composition comprising a polymer containing vinyl sulfonate units having fluorinated hydrophilic groups as a base resin has excellent transparency, substrate adhesion and developer penetrability as well as plasma etching resistance, and is suited for lithographic microprocessing.

6 Claims, No Drawings

POLYMERS, RESIST COMPOSITIONS AND PATTERNING PROCESS

This invention relates to polymers useful as the base resin in resist compositions suited for microfabrication. It also relates to resist compositions, especially chemical amplification resist compositions comprising the polymers, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. To the demand for a resist material with a higher resolution and sensitivity, chemical amplification positive working resist materials which are catalyzed by acids generated upon light exposure are effective as disclosed in U.S. Pat. No. 4,491,628 and U.S. Pat. No. 5,310,619 (JP-B 2-27660 and JP-A 63-27829). They now become predominant resist materials especially adapted for deep UV lithography.

Also, the change-over from i-line (365 nm) to shorter wavelength KrF laser (248 nm) brought about a significant innovation. Resist materials adapted for KrF excimer lasers enjoyed early use on the 0.30 micron process, passed through the 0.25 micron rule, and currently entered the mass production phase on the 0.18 micron rule. Engineers have started investigation on the 0.10 micron rule or below, with the trend toward a finer pattern rule being accelerated.

For ArF laser (193 nm), it is expected to enable miniaturization of the design rule to 0.13 µm or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

With respect to $F_2$ laser (157 nm) which is expected to enable further miniaturization to 0.10 µm or less, more difficulty arises in insuring transparency because it was found that acrylic resins which are used as the base resin for ArF are not transmissive to light at all and those cycloolefin resins having carbonyl bonds have strong absorption. It was also found that poly(vinyl phenol) which is used as the base resin for KrF has a window for absorption in proximity to 160 nm, so the transmittance is somewhat improved, but far below the practical level.

SUMMARY OF THE INVENTION

An object of the invention is to provide a novel polymer having a high transmittance to vacuum ultraviolet radiation of up to 300 nm, especially $F_2$ (157 nm), $Kr_2$ (146 nm), KrAr (134 nm) and $Ar_2$ (126 nm) laser beams, and useful as the base resin in a resist composition. Another object is to provide a resist composition, and especially a chemical amplification resist composition, comprising the polymer, and a patterning process using the same.

It has been found that by incorporating fluorinated hydrophilic groups into ester side chains of a polyvinyl sulfonate and formulating the resulting polyvinyl sulfonate as a base resin, a resist composition, especially chemically amplified resist composition is drastically improved in substrate adhesion and developer affinity without detracting from transparency.

In a first aspect, the invention provides a polymer comprising recurring units of the general formula (1-1) or (1-2) and having a weight average molecular weight of 1,000 to 500,000.

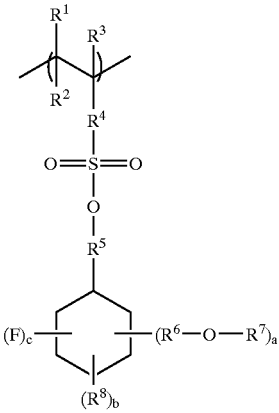
(1-1)

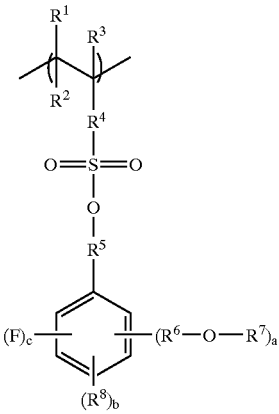
(1-2)

Herein $R^1$ to $R^3$ each are hydrogen, fluorine or a straight, branched or cyclic alkyl or fluorinated alkyl group of 1 to 40 carbon atoms, $R^4$ is a single bond or a straight, branched or cyclic alkylene or fluorinated alkylene group of 1 to 40 carbon atoms, $R^5$ is a single bond or a straight, branched or cyclic alkylene or fluorinated alkylene group of 1 to 40 carbon atoms, $R^6$ is a single bond or a straight, branched or cyclic alkylene or fluorinated alkylene group of 1 to 40 carbon atoms, $R^7$ is hydrogen or an acid labile group, $R^8$ is a straight, branched or cyclic fluorinated alkyl group of 1 to 40 carbon atoms, the subscript a is 1 or 2, b is an integer of 0 to 4, and c is an integer of 0 to 4, satisfying $1 \leq a+b+c \leq 4$.

Preferably the polymer comprises recurring units of at least one type selected from the following formulae (1a) to (1d).

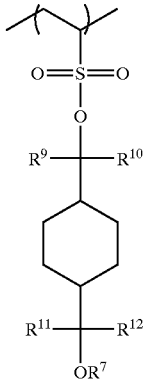
(1a)

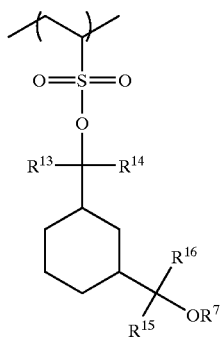
(1b)

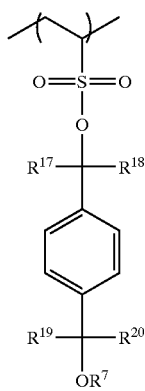
(1c)

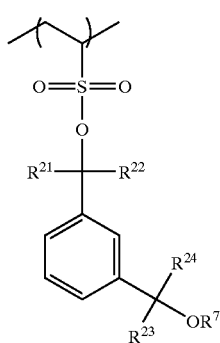
(1d)

Herein $R^7$ is as defined above, $R^9$ to $R^{24}$ each are hydrogen, fluorine or a straight, branched or cyclic alkyl or fluorinated alkyl group of 1 to 4 carbon atoms, and at least either one of $R^9$ and $R^{10}$, at least either one of $R^{11}$ and $R^{12}$, at least either one of $R^{13}$ and $R^{14}$, at least either one of $R^{15}$ and $R^{16}$, at least either one of $R^{17}$ and $R^{18}$, at least either one of $R^{19}$ and $R^{20}$, at least either one of $R^{21}$ and $R^{22}$, and at least either one of $R^{23}$ and $R^{24}$ respectively contain at least one fluorine atom.

In one preferred embodiment, the polymer further includes recurring units of the following general formula (2).

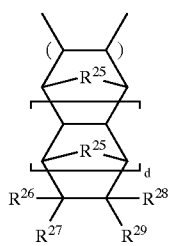
(2)

Herein $R^{25}$ is a methylene group, oxygen atom or sulfur atom, $R^{26}$ to $R^{29}$ each are hydrogen, fluorine, —$R^{30}$—$OR^{31}$, —$R^{30}$—$CO_2R^{31}$ or a straight, branched or cyclic alkyl or fluorinated alkyl group of 1 to 40 carbon atoms, at least one of $R^{26}$ to $R^{29}$ contains —$R^{30}$—$OR^{31}$ or —$R^{30}$—$CO_2R^{31}$, $R^{30}$ is a single bond or a straight, branched or cyclic alkylene or fluorinated alkylene group of 1 to 40 carbon atoms, $R^{31}$ is hydrogen, an acid labile group, an adhesive group or a straight, branched or cyclic fluorinated alkyl group of 1 to 40 carbon atoms which may contain a hydrophilic group such as hydroxyl, and d is 0 or 1.

Preferably, the recurring units of formula (2) have a structure represented by the following formula (2a) or (2b).

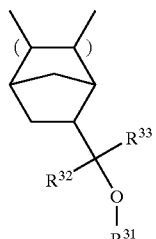
(2a)

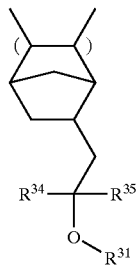
(2b)

Herein $R^{31}$ is as defined above, $R^{32}$ to $R^{35}$ each are hydrogen, fluorine or an alkyl or fluorinated alkyl group of 1 to 4 carbon atoms, at least either one of $R^{32}$ and $R^{33}$ and at least either one of $R^{34}$ and $R^{35}$ contain at least one fluorine atom.

In another preferred embodiment, the polymer further includes recurring units of the following general formula (3).

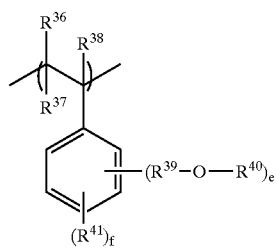
(3)

Herein $R^{36}$ to $R^{38}$ each are hydrogen, fluorine or a straight, branched or cyclic alkyl or fluorinated alkyl group of 1 to 40 carbon atoms, $R^{39}$ is a single bond or a straight, branched or cyclic alkylene or fluorinated alkylene group of 1 to 40 carbon atoms, $R^{40}$ is hydrogen or an acid labile group, $R^{41}$ is fluorine or a straight, branched or cyclic fluorinated alkyl group of 1 to 40 carbon atoms, e is 1 or 2, and f is an integer of 0 to 4, satisfying $1 \leq e+f \leq 5$.

Preferably, the recurring units of formula (3) have the following formula (3a) or (3b).

(3a)

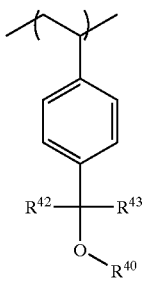

(3b)

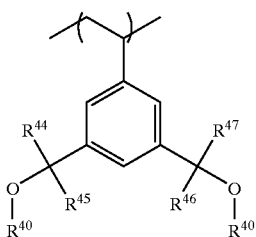

Herein $R^{40}$ is as defined above, $R^{42}$ to $R^{47}$ each are hydrogen, fluorine or a straight, branched or cyclic alkyl or fluorinated alkyl group of 1 to 4 carbon atoms, at least either one of $R^{42}$ and $R^{43}$, at least either one of $R^{44}$ and $R^{45}$ and at least either one of $R^{46}$ and $R^{47}$ contain at least one fluorine atom.

In a further preferred embodiment, the polymer further includes recurring units of the following general formula (4).

(4)

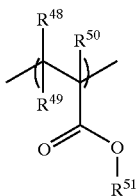

Herein $R^{48}$ to $R^{50}$ each are hydrogen, fluorine or a straight, branched or cyclic alkyl or fluorinated alkyl group of 1 to 40 carbon atoms, and $R^{51}$ is hydrogen, an acid labile group, an adhesive group or a straight, branched or cyclic fluorinated alkyl group of 1 to 40 carbon atoms which may contain a hydrophilic group such as hydroxyl. In formula (4), $R^{51}$ is typically trifluoromethyl.

In a second aspect, the invention provides a resist composition comprising the polymer defined above, most often a chemically amplified positive resist composition comprising (A) the polymer defined above, (B) an organic solvent, and (C) a photoacid generator. The resist composition may further include (D) a basic compound and/or (E) a dissolution inhibitor.

In a third aspect, the invention provides a process for forming a resist pattern comprising the steps of (1) applying the resist composition onto a substrate to form a coating; (2) heat treating the coating and then exposing it to high-energy radiation in a wavelength band of 100 to 180 nm or 1 to 30 nm through a photomask; and (3) optionally heat treating the exposed coating and developing it with a developer. The high-energy radiation is most often an $F_2$ laser beam, $Ar_2$ laser beam or soft x-ray.

DESCRIPTION OF THE PREFERRED EMBODIMENTS

Polymer

For improving the transmittance in proximity to 157 nm, reducing the number of carbonyl groups and/or carbon-to-carbon double bonds is contemplated to be one effective way. It was also found that introducing fluorine atoms into base polymers makes a great contribution to improved transmittance. In fact, poly(vinyl phenol) having fluorine introduced in its aromatic rings offers a transmittance nearly on a practically acceptable level. However, this base polymer was found to turn to be negative upon exposure to high-energy radiation as from an $F_2$ laser, interfering with its use as a practical resist. In contrast, those polymers obtained by introducing fluorine into acrylic resins or polymers containing in their backbone an alicyclic compound originating from a norbornene derivative were found to be transparent and overcome the negative turning problem. Increasing the rate of introduction of fluorine can enhance the transparency of the resin, but tends to sacrifice the substrate adhesion and developer penetrability of the resin.

Quite unexpectedly, it has been found that sulfonates have a high transmittance in proximity to 157 nm despite the inclusion of two sulfur-to-oxygen double bonds and polymers comprising such units are drastically improved in substrate adhesion and developer penetrability over the prior art fluorinated polymers.

It has been found that polymers (or high molecular weight compounds) comprising recurring units of at least one type represented by the formula (1-1) or (1-2), especially formula (1a) to (1d), shown below, are drastically improved in transparency while minimizing a loss of substrate adhesion and developer repellency from which the prior art fluorinated materials have suffered.

(1-1)

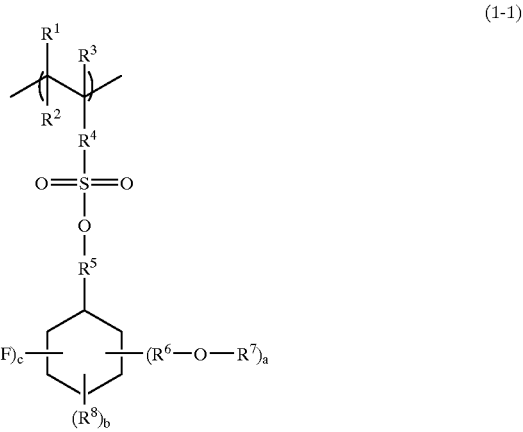

(1a)

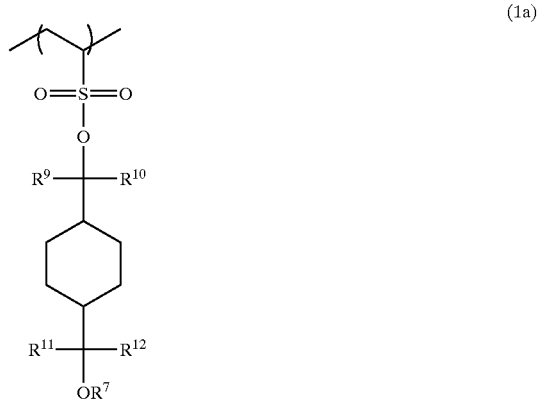

-continued (1b)

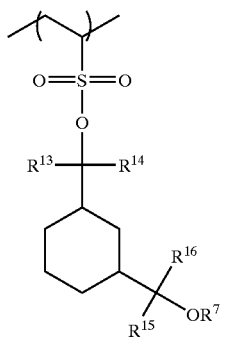

(1-2)

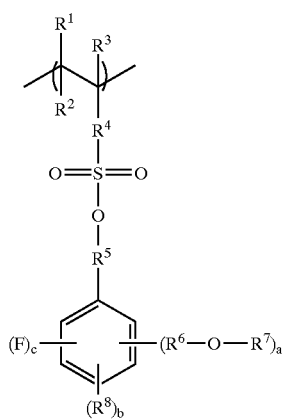

(1c)

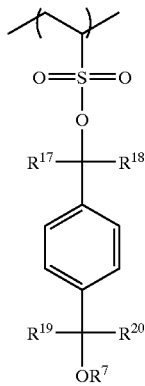

(1d)

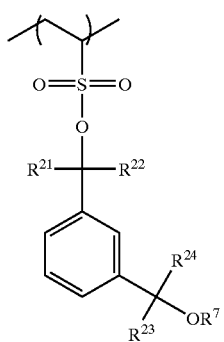

Herein each of $R^1$ to $R^3$ is a hydrogen atom, fluorine atom or a straight, branched or cyclic alkyl or fluorinated alkyl group of 1 to 40 carbon atoms, preferably 1 to 12 carbon atoms, more preferably 1 to 10 carbon atoms. $R^4$ is a single bond or a straight, branched or cyclic alkylene or fluorinated alkylene group of 1 to 40 carbon atoms, preferably 1 to 12 carbon atoms, more preferably 1 to 10 carbon atoms. $R^5$ is a single bond or a straight, branched or cyclic alkylene or fluorinated alkylene group of 1 to 40 carbon atoms, preferably 1 to 12 carbon atoms, more preferably 1 to 10 carbon atoms. $R^6$ is a single bond or a straight, branched or cyclic alkylene or fluorinated alkylene group of 1 to 40 carbon atoms, preferably 1 to 12 carbon atoms, more preferably 1 to 10 carbon atoms. $R^7$ is hydrogen or an acid labile group. $R^8$ is a straight, branched or cyclic fluorinated alkyl group of 1 to 40 carbon atoms, preferably 1 to 12 carbon atoms, more preferably 1 to 10 carbon atoms. The subscript a is 1 or 2, b is an integer of 0 to 4, and c is an integer of 0 to 4, satisfying $1 \leq a+b+c \leq 4$.

Each of $R^9$ to $R^{24}$ is a hydrogen atom, fluorine atom or a straight, branched or cyclic alkyl or fluorinated alkyl group of 1 to 4 carbon atoms. At least either one of $R^9$ and $R^{10}$, at least either one of $R^{11}$ and $R^{12}$, at least either one of $R^{13}$ and $R^{14}$, at least either one of $R^{15}$ and $R^{16}$, at least either one of $R^{17}$ and $R^{18}$, at least either one of $R^{19}$ and $R^{20}$, at least either one of $R^{21}$ and $R^{22}$, and at least either one of $R^{23}$ and $R^{24}$ respectively contain one or more fluorine atoms.

Suitable straight, branched or cyclic alkyl groups are of 1 to 40 carbon atoms, preferably 1 to 12 carbon atoms, especially 1 to 10 carbon atoms and include, but are not limited to, methyl, ethyl, propyl, isopropyl, n-butyl, sec-butyl, tert-butyl, cyclopentyl, cyclohexyl, cyclohexylmethyl, 2-ethylhexyl, n-octyl, 2-adamantyl and (2-adamantyl)methyl.

Suitable fluorinated alkyl groups correspond to the foregoing alkyl groups in which some or all of the hydrogen atoms are substituted with fluorine atoms, and include, for example, trifluoromethyl, 2,2,2-trifluoroethyl, 3,3,3-trifluoropropyl, 1,1,1,3,3,3-hexafluoroisopropyl, and 1,1,2,2,3,3,3-heptafluoropropyl as well as groups as shown below.

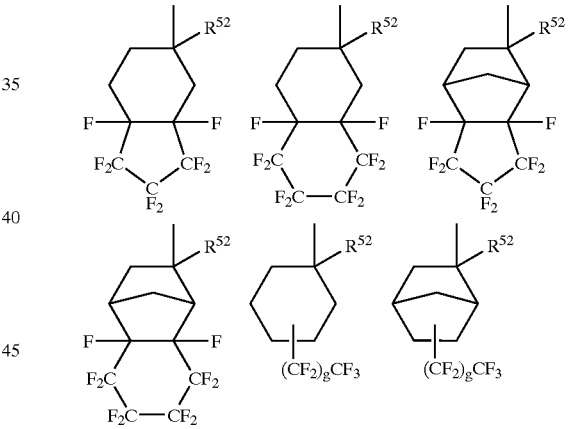

Herein, $R^{52}$ is a hydrogen atom, fluorine atom or a straight, branched or cyclic alkyl or fluorinated alkyl group of 1 to 20 carbon atoms, and g is an integer of 0 to 10.

The straight, branched or cyclic alkylene groups of 1 to 40 carbon atoms correspond to the foregoing alkyl groups with one hydrogen eliminated. Suitable fluorinated alkylene groups correspond to the alkylene groups in which some or all of the hydrogen atoms are substituted with fluorine atoms.

Suitable alkyl groups of 1 to 4 carbon atoms include methyl, ethyl, propyl, isopropyl, n-butyl, sec-butyl, and tert-butyl. Suitable fluorinated alkyl groups of 1 to 4 carbon atoms correspond to these alkyl groups in which some or all of the hydrogen atoms are substituted with fluorine atoms, and include, for example, trifluoromethyl, 2,2,2-trifluoroethyl, 3,3,3-trifluoropropyl, 1,1,1,3,3,3-hexafluoroisopropyl, and 1,1,2,2,3,3,3-heptafluoropropyl.

In addition to the sulfonate units of formula (1-1) or (1-2), especially (1a) to (1d), the polymer of the invention may include recurring units of one or more types represented by the general formulae (2), (3) and (4), especially (2a) and (2b), (3a) and (3b).

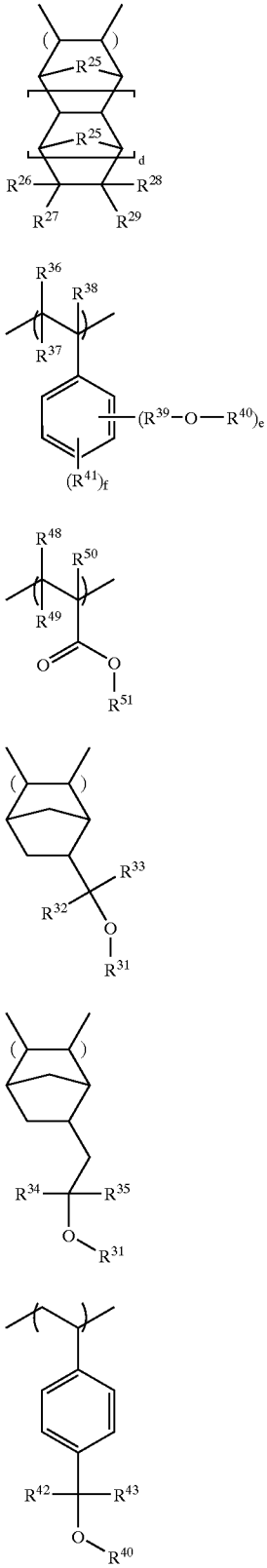

(2)

(3)

(4)

(2a)

(2b)

(3a)

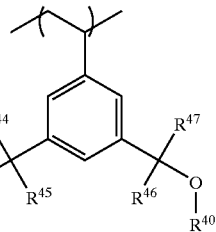

(3b)

Herein $R^{25}$ is a methylene group, oxygen atom or sulfur atom. Each of $R^{26}$ to $R^{29}$ is a hydrogen atom, fluorine atom, $-R^{30}-OR^{31}$, $-R^{30}-CO_2R^{31}$ or a straight, branched or cyclic alkyl or fluorinated alkyl group of 1 to 40 carbon atoms, preferably 1 to 12 carbon atoms, more preferably 1 to 10 carbon atoms. At least one of $R^{26}$ to $R^{29}$ contains $-R^{30}-OR^{31}$ or $-R^{30}-CO_2R^{31}$. $R^{30}$ is a single bond or a straight, branched or cyclic alkylene or fluorinated alkylene group of 1 to 40 carbon atoms, preferably 1 to 12 carbon atoms, more preferably 1 to 10 carbon atoms. $R^{31}$ is a hydrogen atom, an acid labile group, an adhesive group or a straight, branched or cyclic fluorinated alkyl group of 1 to 40 carbon atoms, preferably 1 to 12 carbon atoms, more preferably 1 to 10 carbon atoms, which may contain a hydrophilic group such as hydroxyl. The subscript d is 0 or 1.

Each of $R^{32}$ to $R^{35}$ is a hydrogen atom, fluorine atom or an alkyl or fluorinated alkyl group of 1 to 4 carbon atoms. At least either one of $R^{32}$ and $R^{33}$ and at least either one of $R^{34}$ and $R^{35}$ contain one or more fluorine atoms.

Each of $R^{36}$ to $R^{38}$ is a hydrogen atom, fluorine atom or a straight, branched or cyclic alkyl or fluorinated alkyl group of 1 to 40 carbon atoms, preferably 1 to 12 carbon atoms, more preferably 1 to 10 carbon atoms. $R^{39}$ is a single bond or a straight, branched or cyclic alkylene or fluorinated alkylene group of 1 to 40 carbon atoms, preferably 1 to 12 carbon atoms, more preferably 1 to 10 carbon atoms. $R^{40}$ is hydrogen or an acid labile group. $R^{41}$ is fluorine or a straight, branched or cyclic fluorinated alkyl group of 1 to 40 carbon atoms, preferably 1 to 12 carbon atoms, more preferably 1 to 10 carbon atoms. The subscript e is 1 or 2, and f is an integer of 0 to 4, satisfying $1 \leq e+f \leq 5$.

Each of $R^{42}$ to $R^{47}$ is a hydrogen atom, fluorine atom or a straight, branched or cyclic alkyl or fluorinated alkyl group of 1 to 4 carbon atoms. At least either one of $R^{42}$ and $R^{43}$, at least either one of $R^{44}$ and $R^{45}$ and at least either one of $R^{46}$ and $R^{47}$ contain one or more fluorine atoms.

Each of $R^{48}$ to $R^{50}$ is a hydrogen atom, fluorine atom or a straight, branched or cyclic alkyl or fluorinated alkyl group of 1 to 40 carbon atoms, preferably 1 to 12 carbon atoms, more preferably 1 to 10 carbon atoms. $R^{51}$ is a hydrogen atom, an acid labile group, an adhesive group or a straight, branched or cyclic fluorinated alkyl group of 1 to 40 carbon atoms, preferably 1 to 12 carbon atoms, more preferably 1 to 10 carbon atoms, which may contain a hydrophilic group such as hydroxyl. Typically $R^{51}$ is trifluoromethyl.

Examples of these alkyl, fluorinated alkyl, alkylene and fluorinated alkylene groups are as listed above.

The acid labile groups represented by $R^{12}$, $R^{22}$ and $R^{29}$ are selected from a variety of such groups, preferably from among the groups of the following general formulae (5) to (7).

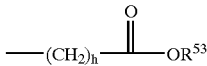

(5)

-continued

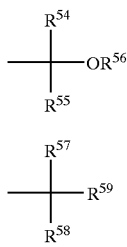

(6)

(7)

In formula (5), $R^{53}$ is a tertiary alkyl group of 4 to 20 carbon atoms, preferably 4 to 15 carbon atoms, or an oxoalkyl group of 4 to 20 carbon atoms. Suitable tertiary alkyl groups include tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Suitable oxoalkyl groups include 3-oxocyclohexyl, 4-methyl-2-oxooxan-4-yl, and 5-methyl-5-oxooxolan-4-yl. The subscript h is an integer of 0 to 6.

Illustrative, non-limiting, examples of the acid labile group of formula (5) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

In formula (6), $R^{54}$ and $R^{55}$ are hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^{45}$ is a monovalent hydrocarbon group of 1 to 18 carbon atoms, preferably 1 to 10 carbon atoms, which may contain a hetero atom such as oxygen, for example, straight, branched or cyclic alkyl groups and substituted ones of these alkyl groups in which some hydrogen atoms are substituted with hydroxyl, alkoxy, oxo, amino or alkylamino groups. Exemplary substituted alkyl groups are shown below.

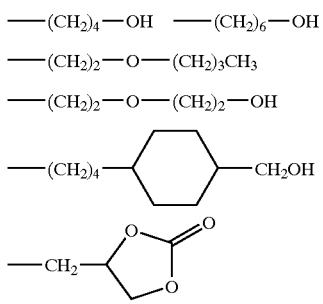

A pair of $R^{54}$ and $R^{55}$, a pair of $R^{54}$ and $R^{56}$, or a pair of $R^{55}$ and $R^{56}$ may bond together to form a ring. Each of $R^{54}$, $R^{55}$ and $R^{56}$ is a straight or branched alkylene group of 1 to 18 carbon atoms, preferably 1 to 10 carbon atoms, when they form a ring.

Of the acid labile groups of formula (6), straight or branched ones are exemplified by the following groups.

—CH₂—O—CH₃   —CH₂—O—CH₂CH₃
—CH₂—O—(CH₂)₂CH₃   —CH₂—O—(CH₂)₃CH₃

$$\begin{array}{c}CH_3\\|\\-CH_2-O-CH-CH_3\end{array} \quad \begin{array}{c}CH_3\\|\\-CH_2-O-C-CH_3\\|\\CH_3\end{array}$$

$$\begin{array}{c}CH_3\\|\\-CH-O-CH_3\end{array} \quad \begin{array}{c}CH_2CH_3\\|\\-CH-O-CH_3\end{array}$$

$$\begin{array}{c}(CH_2)_2CH_3\\|\\-CH-O-CH_3\end{array} \quad \begin{array}{c}CH_3\\|\\-CH-O-CH_2CH_3\end{array}$$

$$\begin{array}{c}CH_2CH_3\\|\\-CH-O-CH_2CH_3\end{array} \quad \begin{array}{c}CH_3\\|\\-CH-O-(CH_2)_2CH_3\end{array}$$

$$\begin{array}{c}CH_3\\|\\-CH-O-(CH_2)_3CH_3\end{array} \quad \begin{array}{c}CH_2CH_3\\|\\-CH-O-(CH_2)_2CH_3\end{array}$$

$$\begin{array}{c}CH_2CH_3\\|\\-CH-O-(CH_2)_3CH_3\end{array} \quad \begin{array}{c}(CH_2)_2CH_3\\|\\-CH-O-(CH_2)_2CH_3\end{array}$$

$$\begin{array}{c}(CH_2)_2CH_3\\|\\-CH-O-(CH_2)_3CH_3\end{array} \quad \begin{array}{c}CH_3\\|\\-C-O-CH_3\\|\\CH_3\end{array}$$

$$\begin{array}{c}CH_3\\|\\-C-O-CH_2CH_3\\|\\CH_3\end{array} \quad \begin{array}{c}CH_3\\|\\-CH-O-\text{cyclopentyl}\end{array}$$

$$\begin{array}{c}CH_3\\|\\-CH-O-\text{cyclohexyl}\end{array}$$

Of the acid labile groups of formula (6), cyclic ones are exemplified by tetrahydrofuran-2-yl, 2-methyltetrahydrofuran-2-yl, tetrahydropyran-2-yl, and 2-methyltetrahydropyran-2-yl.

Of the groups of formula (6), ethoxyethyl, butoxyethyl and ethoxypropyl are preferred.

In formula (7), $R^{57}$, $R^{58}$ and $R^{59}$ each are a monovalent hydrocarbon group, typically a straight, branched or cyclic alkyl group of 1 to 20 carbon atoms, which may contain a hetero atom such as oxygen, sulfur, nitrogen or fluorine. A pair of $R^{57}$ and $R^{58}$, $R^{57}$ and $R^{59}$, and $R^{58}$ and $R^{59}$, taken together, may form a ring with the carbon atom to which they are bonded.

Examples of the tertiary alkyl group represented by formula (7) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, tert-amyl, 1,1,1,3,3,3-hexafluoro-2-methyl-isopropyl, and 1,1,1,3,3,3-hexafluoro-2-cyclohexyl-isopropyl as well as the groups shown below.

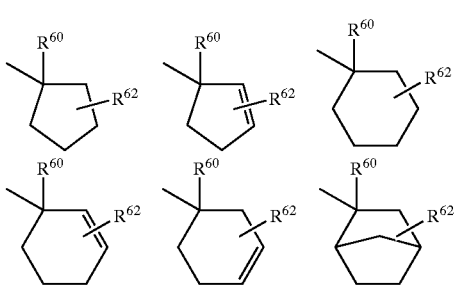

-continued

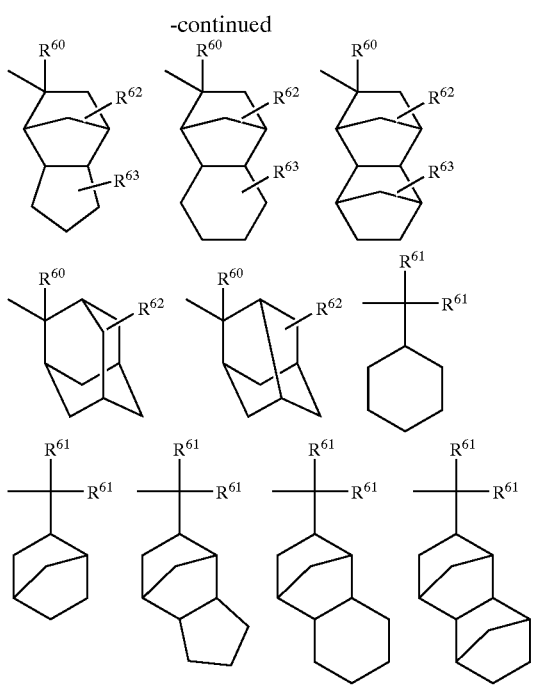

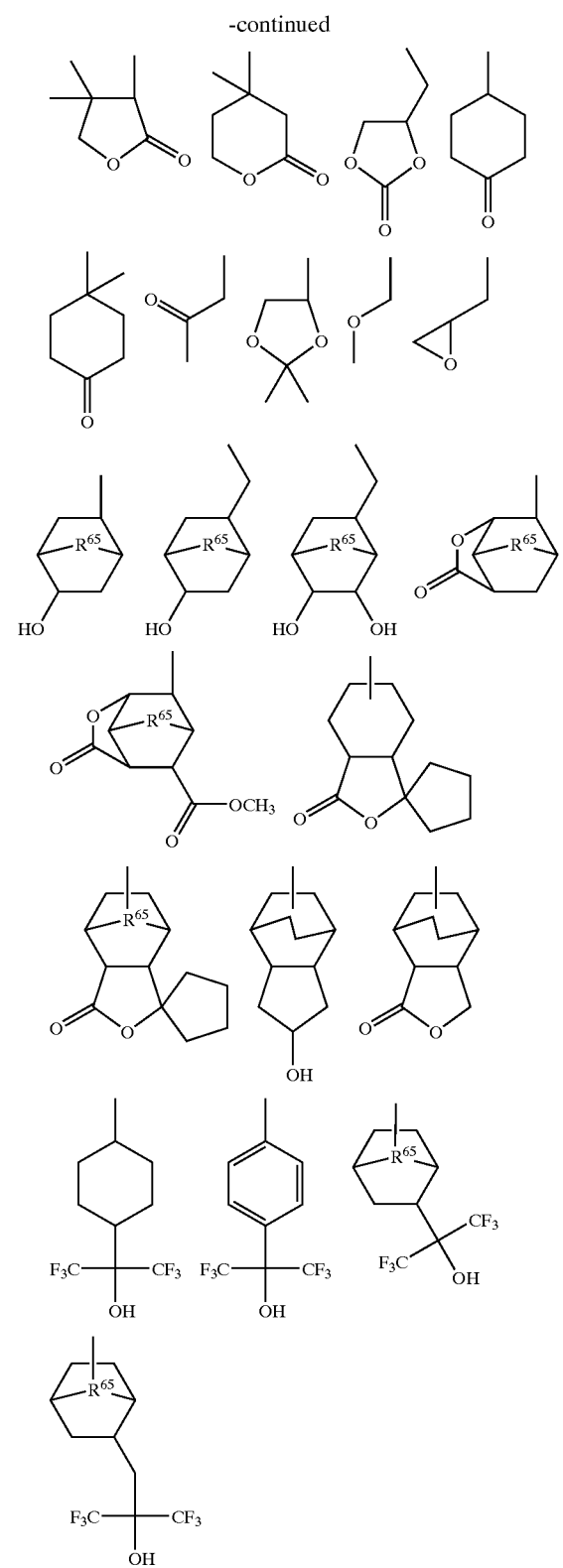

Herein, $R^{60}$ is a straight, branched or cyclic alkyl group of 1 to 6 carbon atoms, such as methyl, ethyl, propyl, isopropyl, n-butyl, sec-butyl, n-pentyl, n-hexyl, cyclopropyl, cyclopropylmethyl, cyclobutyl, cyclopentyl and cyclohexyl. $R^{61}$ is a straight, branched or cyclic alkyl group of 2 to 6 carbon atoms, such as ethyl, propyl, isopropyl, n-butyl, sec-butyl, n-pentyl, n-hexyl, cyclopropyl, cyclopropylmethyl, cyclobutyl, cyclopentyl and cyclohexyl. Each of $R^{62}$ and $R^{63}$ is hydrogen, a monovalent hydrocarbon group of 1 to 6 carbon atoms which may contain a hetero atom, or a monovalent hydrocarbon group of 1 to 6 carbon atoms which may be separated by a hetero atom. These groups may be straight, branched or cyclic. The hetero atom is typically selected from oxygen, sulfur and nitrogen atoms and may be contained or intervene in the form of —OH, —$OR^{64}$, —O—, —S—, —S(=O)—, —$NH_2$, —$NHR^{64}$, —$N(R^{64})_2$, —NH— or —$NR^{64}$— wherein $R^{64}$ is an alkyl group of 1 to 5 carbon atoms. Examples of $R^{62}$ and $R^{63}$ groups include methyl, hydroxymethyl, ethyl, hydroxyethyl, propyl, isopropyl, n-butyl, sec-butyl, n-pentyl, n-hexyl, methoxy, methoxymethoxy, ethoxy and tert-butoxy.

Next, the adhesive groups represented by $R^{31}$ and $R^{51}$ are selected from a variety of such groups, preferably from among the groups of the following general formulae.

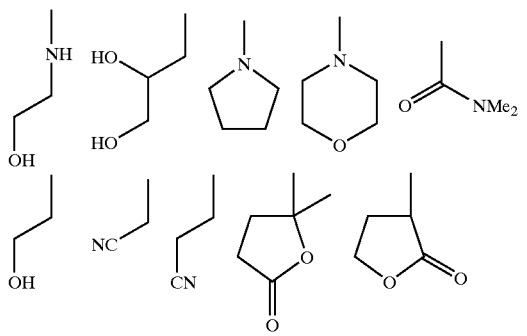

$R^{65}$ is a methylene group, oxygen atom or sulfur atom.

Illustrative examples of the units represented by formulae (1-1) and (1-2) are given below, though not limited thereto.

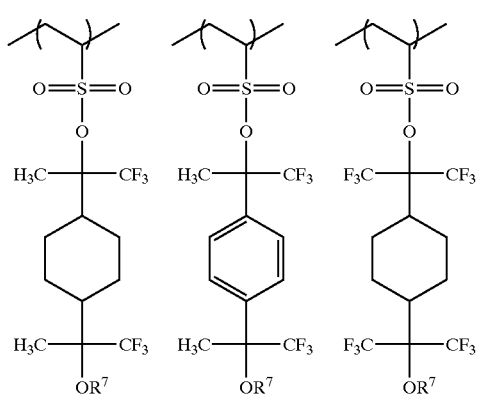
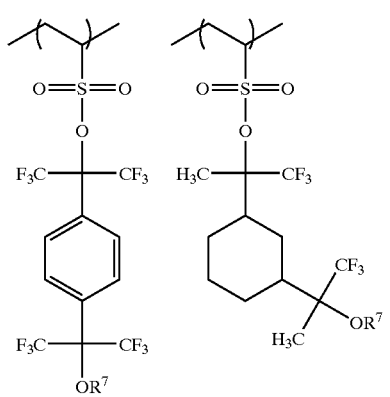
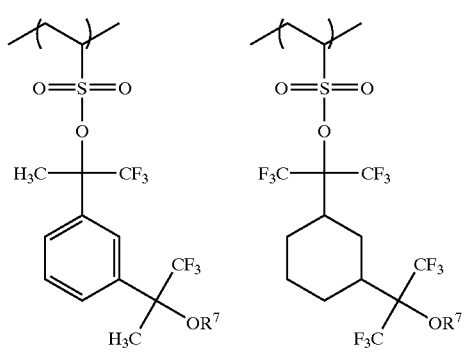
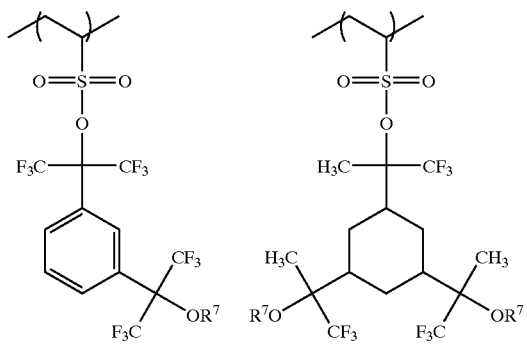
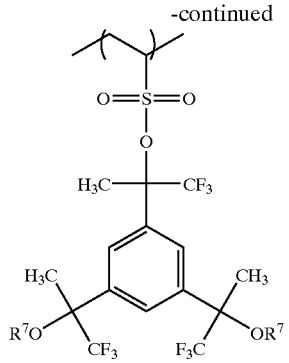
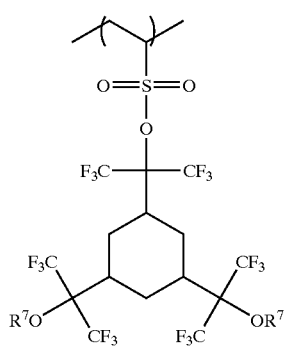
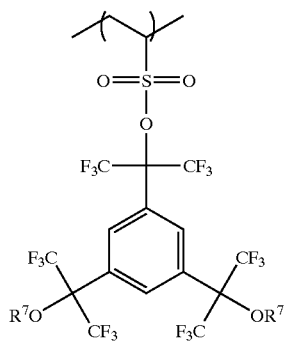
$R^7$ is as defined above.
Illustrative examples of the units represented by formula (2) are given below, though not limited thereto.
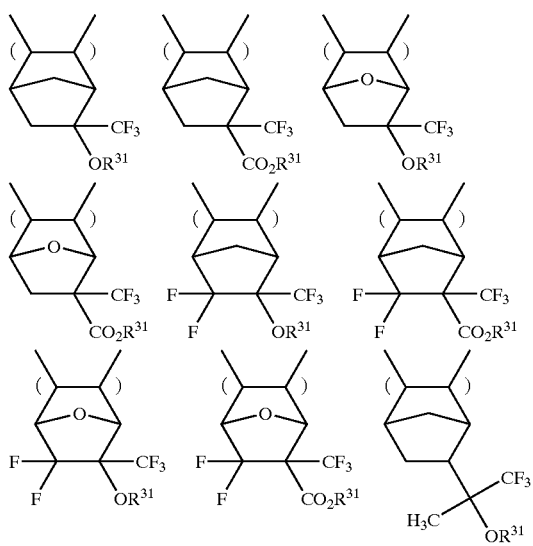

-continued
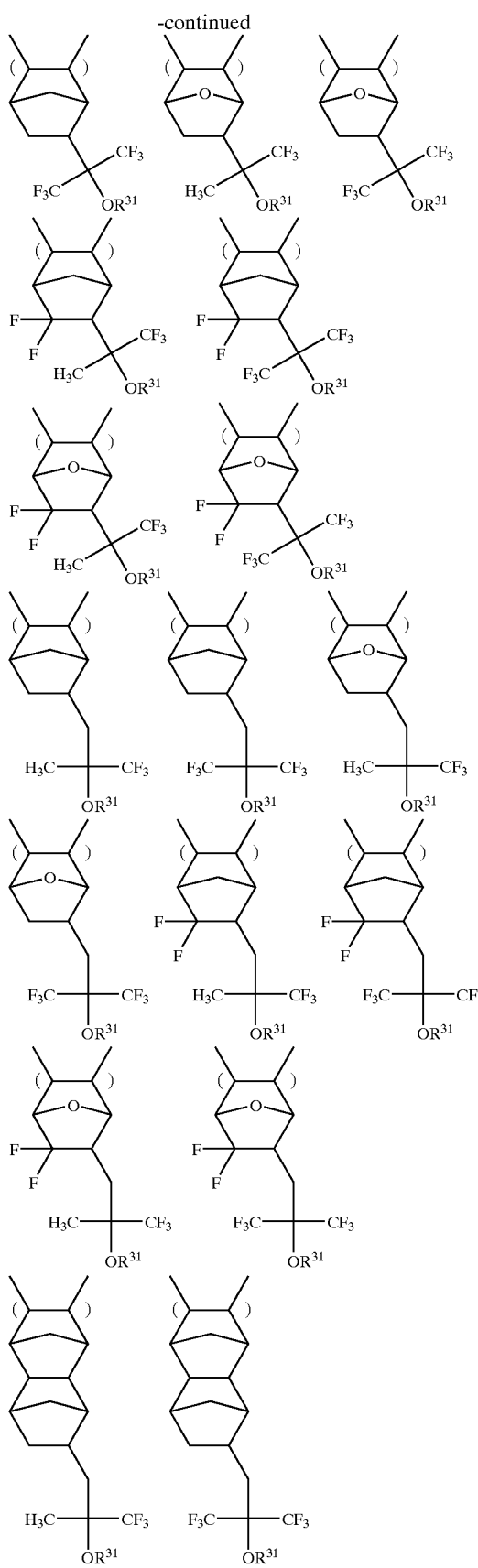
$R^{31}$ is as defined above.
Illustrative examples of the units represented by formula (3) are given below, though not limited thereto.
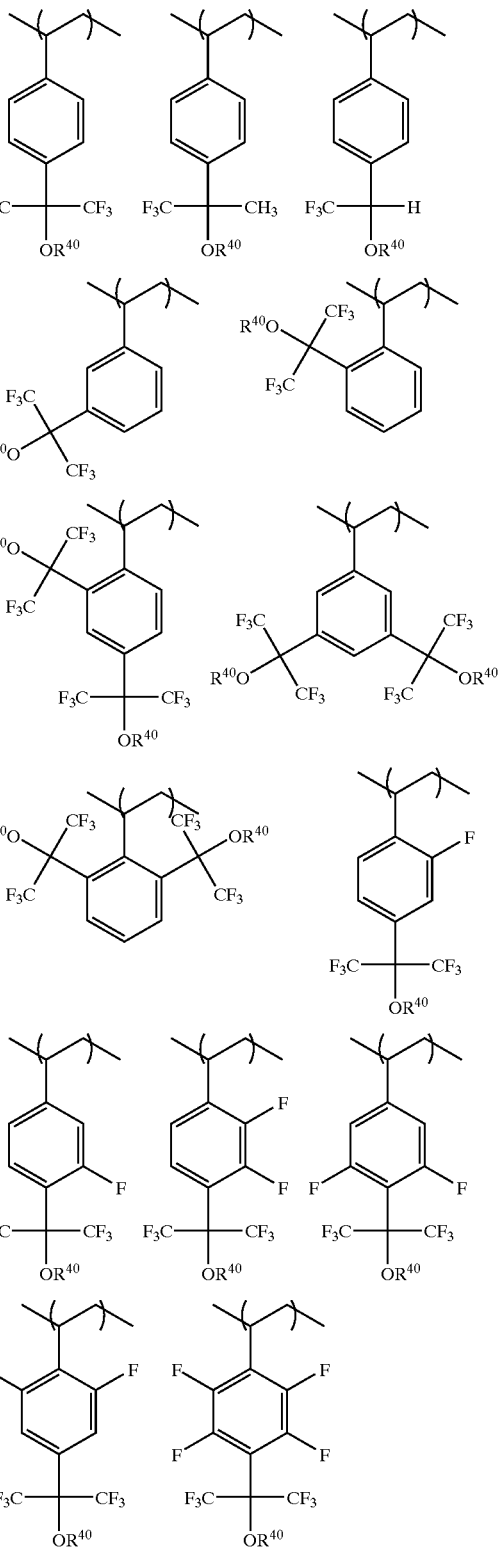

-continued

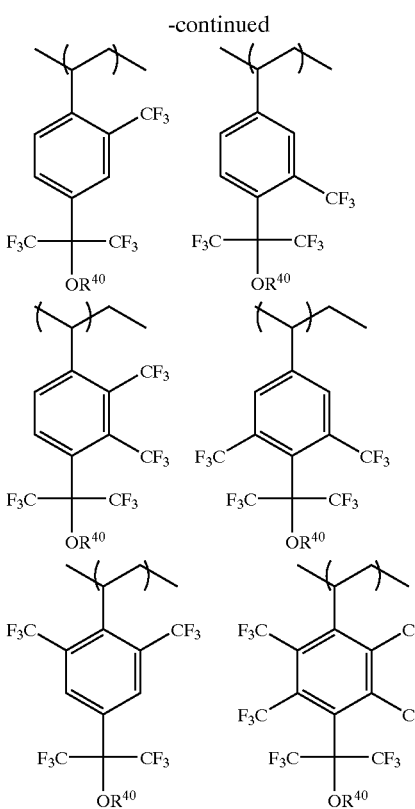

$R^{40}$ is as defined above.

Besides the units of formulae (1) to (4), adhesive units as shown below may also be incorporated in the inventive polymers for the purpose of further improving adhesion.

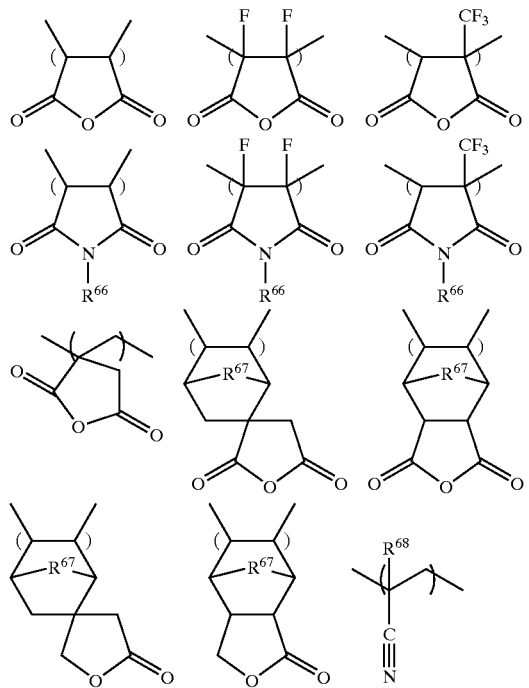

-continued

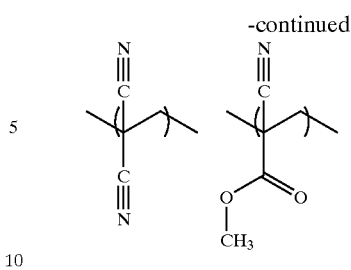

Herein, each of $R^{66}$ to $R^{68}$ is hydrogen, fluorine or a straight, branched or cyclic alkyl or fluorinated alkyl group of 1 to 20 carbon atoms. $R^{67}$ is a methylene group, oxygen atom or sulfur atom.

Besides the units of formulae (1) to (4), units as shown below may also be incorporated in the inventive polymers for the purpose of improving transparency.

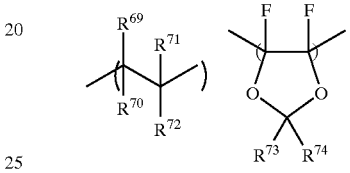

Herein, each of $R^{69}$ to $R^{72}$ is fluorine, hydrogen or a fluorinated alkyl group of 1 to 4 carbon atoms, at least one of $R^{69}$ to $R^{72}$ contains one or more fluorine atoms. Each of $R^{73}$ and $R^{74}$ is hydrogen, methyl or trifluoromethyl.

The polymer of the invention is generally synthesized by dissolving a monomer providing recurring units of formula (1-1) or (1-2) and optionally, monomers providing recurring units of formulae (2), (3) and (4), an adhesion-improving monomer, a transparency-improving monomer or the like in a solvent, adding a catalyst thereto, and effecting polymerization reaction while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for preparation of the polymer of the invention are radical polymerization of triggering polymerization with radicals of 2,2'-azobisisobutyronitrile (AIBN) or the like, and ion (anion) polymerization using catalysts such as alkyl lithium. These polymerization steps may be carried out in their conventional manner.

The radical polymerization initiator used herein is not critical. Exemplary initiators include azo compounds such as AIBN, 2,2'-azobis(4-methoxy-2,4-dimethylvaleronitrile), 2,2'-azobis(2,4-dimethylvaleronitrile), and 2,2'-azobis(2,4,4-trimethylpentane); peroxide compounds such as tert-butyl peroxypivalate, lauroyl peroxide, benzoyl peroxide and tert-butyl peroxylaurate; water-soluble initiators, for example, persulfate salts such as potassium persulfate; and redox combinations of potassium persulfate or peroxides such as hydrogen peroxide with reducing agents such as sodium sulfite. The amount of the polymerization initiator used is determined as appropriate in accordance with such factors as the identity of initiator and polymerization conditions, although the amount is often in the range of about 0.001 to 5% by weight, especially about 0.01 to 2% by weight based on the total weight of monomers to be polymerized.

For the polymerization reaction, a solvent may be used. The polymerization solvent used herein is preferably one which does not interfere with the polymerization reaction. Typical solvents include ester solvents such as ethyl acetate and n-butyl acetate, ketone solvents such as acetone, methyl ethyl ketone and methyl isobutyl ketone, aliphatic or aromatic hydrocarbon solvents such as toluene, xylene and cyclohexane, alcohol solvents such as isopropyl alcohol and ethylene glycol monomethyl ether, and ether solvents such as diethyl ether, dioxane, and tetrahydrofuran. These solvents may be used alone or in admixture of two or more. Further, any of well-known molecular weight modifiers such as dodecylmercaptan may be used in the polymerization system.

The temperature of polymerization reaction varies in accordance with the identity of polymerization initiator and the boiling point of the solvent although it is often preferably in the range of about 20 to 200° C., and especially about 50 to 140° C. Any desired reactor or vessel may be used for the polymerization reaction.

From the solution or dispersion of the polymer thus obtained, the organic solvent or water serving as the reaction medium is removed by any of well-known techniques. Suitable techniques include, for example, re-precipitation followed by filtration, and heat distillation under vacuum.

Desirably the polymer has a weight average molecular weight of about 1,000 to about 500,000, and especially about 2,000 to about 100,000.

Provided that U1 represents units of formula (1-1) or (1-2), especially (1a) to (1d), U2 represents units of formula (2), especially (2a) or (2b), U3 represents units of formula (3), especially (3a) or (3b), U4 represents units of formula (4), and U5 represents adhesive units and transparent units other than formulae (1) to (4), and U1+U2+U3+U4+U5=1, the inventive polymer preferably satisfies the range:

0<U1≦0.9, more preferably 0.1≦U1≦0.6,
0≦U2≦0.8, more preferably 0≦U2≦0.6,
0≦U3≦0.8, more preferably 0≦U3≦0.6,
0≦U4≦0.8, more preferably 0≦U4≦0.7, and
0≦U5≦0.5, more preferably 0≦U5≦0.2.

The polymer of the invention can be used as a base resin in resist compositions, specifically chemical amplification type resist compositions, and especially chemical amplification type positive working resist compositions. It is understood that the polymer of the invention may be admixed with another polymer for the purpose of altering the dynamic properties, thermal properties, alkali solubility and other physical properties of polymer film. The type of the other polymer which can be admixed is not critical. Any of polymers known to be useful in resist use may be admixed in any desired proportion.

Resist Composition

As long as the polymer of the invention is used as a base resin, the resist composition of the invention may be prepared using well-known components. In a preferred embodiment, the chemically amplified positive resist composition is defined as comprising (A) the above-defined polymer as a base resin, (B) an organic solvent, and (C) a photoacid generator. In the resist composition, there may be further formulated (D) a basic compound and/or (E) a dissolution inhibitor.

Component (B)

The organic solvent used as component (B) in the invention may be any organic solvent in which the base resin (inventive polymer), photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Also useful are fluorinated organic solvents. Illustrative, non-limiting examples include 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, sec-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro-2,5-dimethyl-3,6-dioxane anionic acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxaoctadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol-1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, and 1,1,1-trifluoro-5,5-dimethyl-2,4-hexanedione.

These solvents may be used alone or in combinations of two or more thereof. Of the above organic solvents, preferred are diethylene glycol dimethyl ether and 1-ethoxy-2-propanol, in which the photoacid generator is most soluble, and propylene glycol monomethyl ether acetate which is safe, and mixtures thereof.

The solvent is preferably used in an amount of about 300 to 10,000 parts by weight, more preferably about 500 to 5,000 parts by weight per 100 parts by weight of the base resin.

Component (C)

Suitable examples of the photoacid generator (C) include onium salts of formula (8) below, diazomethane derivatives of formula (9), glyoxime derivatives of formula (10), β-ketosulfone derivatives, disulfone derivatives, nitrobenzylsulfonate derivatives, sulfonic acid ester derivatives, and imidoyl sulfonate derivatives.

The onium salts used as the photoacid generator are of the general formula (8).

$$(R^{75})_iM^+K^- \qquad (8)$$

In the formula, $R^{75}$ is a straight, branched or cyclic alkyl of 1 to 12 carbon atoms, an aryl of 6 to 20 carbon atoms, or an aralkyl of 7 to 12 carbon atoms; $M^+$ is iodonium or sulfonium; $K^-$ is a non-nucleophilic counter-ion; and the letter i is 2 or 3.

Illustrative examples of alkyl groups represented by $R^{75}$ include methyl, ethyl, propyl, butyl, pentyl, 2-oxocyclopentyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

The diazomethane derivatives used as the photoacid generator are of the general formula (9).

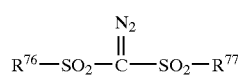

(9)

In the formula, $R^{76}$ and $R^{77}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{76}$ and $R^{77}$ include methyl, ethyl, propyl, butyl, amyl, cyclopentyl, cyclohexyl, norbornyl, and adamantyl. Exemplary halogenated alkyl groups include trifluoromethyl, 2,2,2-trifluoroethyl, 2,2,2-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

The glyoxime derivatives used as the photoacid generator are of the general formula (10).

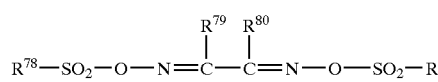

(10)

In the formula, $R^{78}$ to $R^{80}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{79}$ and $R^{80}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{78}$ to $R^{80}$ are exemplified by the same groups as mentioned above for $R^{76}$ and $R^{77}$. Examples of alkylene groups represented by $R^{79}$ and $R^{80}$ include methylene, ethylene, propylene, butylene, and hexylene.

Illustrative, non-limiting examples of the photoacid generators include:
onium salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
cyclohexylmethyl(2-oxocyclohexyl)sulfonium trifluoromethanesulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate],
and 1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime, bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
β-ketosulfone derivatives such as
2-cyclohexylcarbonyl-2-(p-toluenesulfonyl)propane and
2-isopropylcarbonyl-2-(p-toluenesulfonyl)propane;
disulfone derivatives such as diphenyl disulfone and dicyclohexyl disulfone;
nitrobenzyl sulfonate derivatives such as
2,6-dinitrobenzyl p-toluenesulfonate and
2,4-dinitrobenzyl p-toluenesulfonate;
sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
tris(p-tert-butoxyphenyl)sulfonium p-toluenesulfonate,
trinaphthylsulfonium trifluoromethanesulfonate,
cyclohexylmethyl(2-oxocyclohexyl)sulfonium trifluoromethanesulfonate,
(2-norbornyl)methyl(2-oxocylohexyl)sulfonium trifluoromethanesulfonate, and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane; and
glyoxime derivatives such as
bis-O-(p-toluenesulfonyl)-α-dimethylglyoxime and
bis-O-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight per 100 parts by weight of the base resin. At less than 0.2 part, the amount of acid generated during exposure would be too small and the sensitivity and resolution be poor, whereas the addition of more than 15 parts would lower the transparency of the resist and result in a poor resolution.

Component (D)

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include ammonia, primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene.

Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, nicotinic acid, and amino acid derivatives (e.g. alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of suitable sulfonyl group-bearing nitrogenous compounds include 3-pyridinesulfonic acid and pyridinium p-toluenesulfonate.

Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (11) may also be included alone or in admixture.

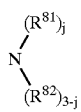

(11)

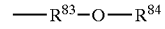

(11a)

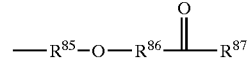

(11b)

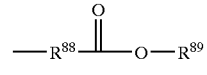

(11c)

In the formulas, j is 1, 2 or 3. The side chain $R^{81}$ may be the same or different and may also bond together to form a ring. $R^{81}$ is represented by the above formula (11a), (11b) or (11c). The side chain $R^{82}$ may be the same or different and stands for hydrogen or a straight, branched or cyclic alkyl group of 1 to 20 carbon atoms which may contain an ether or hydroxyl group. $R^{83}$, $R^{85}$ and $R^{88}$ are independently straight or branched alkylene groups of 1 to 4 carbon atoms. $R^{84}$ and $R^{87}$ are independently hydrogen or straight, branched or cyclic alkyl groups of 1 to 20 carbon atoms which may contain one or more hydroxyl, ether, ester groups or lactone rings. $R^{86}$ is a single bond or a straight or branched alkylene group of 1 to 4 carbon atoms. $R^{89}$ is a straight, branched or cyclic alkyl group of 1 to 20 carbon atoms which may contain one or more hydroxyl, ether, ester groups or lactone rings.

Illustrative, non-limiting examples of the compounds of formula (11) include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-(2-(2-hydroxyethoxy)ethoxy)ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine,
N,N-bis(2-hydroxyethyl)-2-(2-oxopropoxycarbonyl)ethylamine,
N,N-bis(2-acetoxyethyl)-2-(2-oxopropoxycarbonyl)ethylamine,
N,N-bis(2-hydroxyethyl)-2-(tetrahydrofurfuryloxycarbonyl)ethylamine,
N,N-bis(2-acetoxyethyl)-2-(tetrahydrofurfuryloxycarbonyl)ethylamine,
N,N-bis(2-hydroxyethyl)-2-[(2-oxotetrahydrofuran-3-yl)oxycarbonyl]ethylamine,
N,N-bis(2-acetoxyethyl)-2-[(2-oxotetrahydrofuran-3-yl)oxycarbonyl]ethylamine,
N,N-bis(2-hydroxyethyl)-2-(4-hydroxybutoxycarbonyl)ethylamine,
N,N-bis(2-formyloxyethyl)-2-(4-formyloxybutoxycarbonyl)ethylamine,
N,N-bis(2-formyloxyethyl)-2-(2-formyloxyethoxycarbonyl)ethylamine,
N,N-bis(2-methoxyethyl)-2-(methoxycarbonyl)ethylamine,
N-(2-hydroxyethyl)-bis[2-(methoxycarbonyl)ethyl]amine,
N-(2-acetoxyethyl)-bis[2-(methoxycarbonyl)ethyl]amine,
N-(2-hydroxyethyl)-bis[2-(ethoxycarbonyl)ethyl]amine,
N-(2-acetoxyethyl)-bis[2-(ethoxycarbonyl)ethyl]amine,
N-(3-hydroxy-1-propyl)-bis[2-(methoxycarbonyl)ethyl]amine,
N-(3-acetoxy-1-propyl)-bis[2-(methoxycarbonyl)ethyl]amine,
N-(2-methoxyethyl)-bis[2-(methoxycarbonyl)ethyl]amine,
N-butyl-bis[2-(methoxycarbonyl)ethyl]amine,
N-butyl-bis[2-(2-methoxyethoxycarbonyl)ethyl]amine,
N-methyl-bis(2-acetoxyethyl)amine,
N-ethyl-bis(2-acetoxyethyl)amine,
N-methyl-bis(2-pivaloyloxyethyl)amine,
N-ethyl-bis[2-(methoxycarbonyloxy)ethyl]amine,
N-ethyl-bis[2-(tert-butoxycarbonyloxy)ethyl]amine,
tris(methoxycarbonylmethyl)amine,
tris(ethoxycarbonylmethyl)amine,
N-butyl-bis(methoxycarbonylmethyl)amine,
N-hexyl-bis(methoxycarbonylmethyl)amine, and
β-(diethylamino)-δ-valerolactone.

Also useful are one or more of cyclic structure-bearing basic compounds having the following general formula (12).

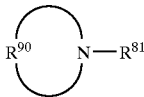
(12)

Herein $R^{81}$ is as defined above, and $R^{90}$ is a straight or branched alkylene group of 2 to 20 carbon atoms which may contain one or more carbonyl, ether, ester or sulfide groups.

Illustrative examples of the cyclic structure-bearing basic compounds having formula (12) include
1-[2-(methoxymethoxy)ethyl]pyrrolidine,
1-[2-(methoxymethoxy)ethyl]piperidine,
4-[2-(methoxymethoxy)ethyl]morpholine,
1-[2-[(2-methoxyethoxy)methoxy]ethyl]pyrrolidine,
1-[2-[(2-methoxyethoxy)methoxy]ethyl]piperidine,
4-[2-[(2-methoxyethoxy)methoxy]ethyl]morpholine,
2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate,
4-[2-(methoxycarbonyloxy)ethyl]morpholine,
1-[2-(t-butoxycarbonyloxy)ethyl]piperidine,
4-[2-(2-methoxyethoxycarbonyloxy)ethyl]morpholine,
methyl 3-(1-pyrrolidinyl)propionate,
methyl 3-piperidinopropionate, methyl 3-morpholinopropionate,
methyl 3-(thiomorpholino)propionate,
methyl 2-methyl-3-(1-pyrrolidinyl)propionate,
ethyl 3-morpholinopropionate,
methoxycarbonylmethyl 3-piperidinopropionate,
2-hydroxyethyl 3-(1-pyrrolidinyl)propionate,
2-acetoxyethyl 3-morpholinopropionate,
2-oxotetrahydrofuran-3-yl 3-(1-pyrrolidinyl)propionate,
tetrahydrofurfuryl 3-morpholinopropionate,
glycidyl 3-piperidinopropionate,
2-methoxyethyl 3-morpholinopropionate,
2-(2-methoxyethoxy)ethyl 3-(1-pyrrolidinyl)propionate,
butyl 3-morpholinopropionate,
cyclohexyl 3-piperidinopropionate,
α-(1-pyrrolidinyl)methyl-γ-butyrolactone,
β-piperidino-γ-butyrolactone, β-morpholino-δ-valerolactone,
methyl 1-pyrrolidinylacetate, methyl piperidinoacetate, methyl morpholinoacetate, methyl thiomorpholinoacetate, ethyl 1-pyrrolidinylacetate, and
2-methoxyethyl morpholinoacetate.

Also, one or more of cyano-bearing basic compounds having the following general formulae (13) to (16) may be blended.

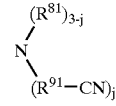
(13)

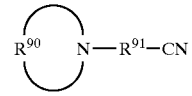
(14)

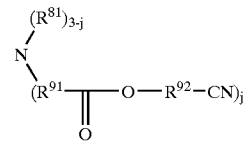
(15)

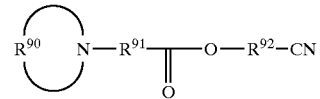
(16)

Herein, $R^{81}$, $R^{90}$ and j are as defined above, and $R^{91}$ and $R^{92}$ each are independently a straight or branched alkylene group of 1 to 4 carbon atoms.

Illustrative examples of the cyano-bearing basic compounds include 3-(diethylamino)propiononitrile,
N,N-bis(2-hydroxyethyl)-3-aminopropiononitrile,
N,N-bis(2-acetoxyethyl)-3-aminopropiononitrile,
N,N-bis(2-formyloxyethyl)-3-aminopropiononitrile,
N,N-bis(2-methoxyethyl)-3-aminopropiononitrile,
N,N-bis[2-(methoxymethoxy)ethyl]-3-aminopropiononitrile,
methyl N-(2-cyanoethyl)-N-(2-methoxyethyl)-3-aminopropionate,
methyl N-(2-cyanoethyl)-N-(2-hydroxyethyl)-3-aminopropionate,
methyl N-(2-acetoxyethyl)-N-(2-cyanoethyl)-3-aminopropionate,
N-(2-cyanoethyl)-N-ethyl-3-aminopropiononitrile,
N-(2-cyanoethyl)-N-(2-hydroxyethyl)-3-aminopropiononitrile, N-(2-acetoxyethyl)-N-(2-cyanoethyl)-3-aminopropiononitrile,
N-(2-cyanoethyl)-N-(2-formyloxyethyl)-3-aminopropiononitrile,
N-(2-cyanoethyl)-N-(2-methoxyethyl)-3-aminopropiononitrile,
N-(2-cyanoethyl)-N-[2-(methoxymethoxy)ethyl]-3-aminopropiononitrile,
N-(2-cyanoethyl)-N-(3-hydroxy-1-propyl)-3-aminopropiononitrile,
N-(3-acetoxy-1-propyl)-N-(2-cyanoethyl)-3-aminopropiononitrile,
N-(2-cyanoethyl)-N-(3-formyloxy-1-propyl)-3-aminopropiononitrile,
N-(2-cyanoethyl)-N-tetrahydrofurfuryl-3-aminopropiononitrile,
N,N-bis(2-cyanoethyl)-3-aminopropiononitrile, diethylaminoacetonitrile,
N,N-bis(2-hydroxyethyl)aminoacetonitrile,
N,N-bis(2-acetoxyethyl)aminoacetonitrile,
N,N-bis(2-formyloxyethyl)aminoacetonitrile,
N,N-bis(2-methoxyethyl)aminoacetonitrile,
N,N-bis[2-(methoxymethoxy)ethyl]aminoacetonitrile,
methyl N-cyanomethyl-N-(2-methoxyethyl)-3-aminopropionate,
methyl N-cyanomethyl-N-(2-hydroxyethyl)-3-aminopropionate,
methyl N-(2-acetoxyethyl)-N-cyanomethyl-3-aminopropionate,
N-cyanomethyl-N-(2-hydroxyethyl)aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile,
N-cyanomethyl-N-[2-(methoxymethoxy)ethyl]aminoacetonitrile,
N-cyanomethyl-N-(3-hydroxy-1-propyl)aminoacetonitrile,
N-(3-acetoxy-1-propyl)-N-(cyanomethyl)aminoacetonitrile,
N-cyanomethyl-N-(3-formyloxy-1-propyl)aminoacetonitrile,
N,N-bis(cyanomethyl)aminoacetonitrile,
1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate,
cyanomethyl N,N-bis(2-hydroxyethyl)-3-aminopropionate,
cyanomethyl N,N-bis(2-acetoxyethyl)-3-aminopropionate,
cyanomethyl N,N-bis(2-formyloxyethyl)-3-aminopropionate,
cyanomethyl N,N-bis(2-methoxyethyl)-3-aminopropionate,
cyanomethyl N,N-bis[2-(methoxymethoxy)ethyl]-3aminopropionate,
2-cyanoethyl 3-diethylaminopropionate,
2-cyanoethyl N,N-bis(2-hydroxyethyl)-3-aminopropionate,
2-cyanoethyl N,N-bis(2-acetoxyethyl)-3-aminopropionate,
2-cyanoethyl N,N-bis(2-formyloxyethyl)-3-aminopropionate,
2-cyanoethyl N,N-bis(2-methoxyethyl)-3-aminopropionate,
2-cyanoethyl N,N-bis[2-(methoxymethoxy)ethyl]-3aminopropionate,
cyanomethyl 1-pyrrolidinepropionate,
cyanomethyl 1-piperidinepropionate,
cyanomethyl 4-morpholinepropionate,
2-cyanoethyl 1-pyrrolidinepropionate,
2-cyanoethyl 1-piperidinepropionate, and
2-cyanoethyl 4-morpholinepropionate.

These basic compounds may be used alone or in admixture of any. The basic compound is preferably formulated in an amount of 0.01 to 2 parts, and especially 0.01 to 1 part by weight, per 100 parts by weight of the base resin. Less than 0.01 part of the basic compound may fail to achieve the desired effects thereof, while the use of more than 2 parts would result in too low a sensitivity.

Component (E)

The dissolution inhibitor (E) is a compound with a molecular weight of up to 3,000 which changes its solubility in an alkaline developer under the action of an acid, and typically selected from phenols, carboxylic acid derivatives, and hexafluoroisopropanol-containing compounds in which some or all of hydroxyl groups are substituted with acid labile groups and which have a molecular weight of up to 2,500.

Examples of the phenol or carboxylic acid derivative having a molecular weight of up to 2,500 include
4,4'-(1-methylethylidene)bisphenol,
(1,1'-biphenyl-4,4'-diol)-2,2'-methylenebis(4-methylphenol),
4,4-bis(4'-hydroxyphenyl)valeric acid,
tris(4-hydroxyphenyl)methane,
1,1,1-tris(4'-hydroxyphenyl)ethane,
1,1,2-tris(4'-hydroxyphenyl)ethane, phenolphthalein,
thimolphthalein, 3,3'-difluoro[(1,1'-biphenyl)-4,4'-diol],
3,3',5,5'-tetrafluoro[(1,1'-biphenyl)-4,4'-diol],
4,4'-[2,2,2-trifluoro-1-(trifluoromethyl)ethylidene]bisphenol,
4,4'-methylenebis(2-fluorophenol),
2,2'-methylenebis(4-fluorophenol),
4,4'-isopropylidenebis(2-fluorophenol), cyclohexylidenebis(2-fluorophenol),
4,4'-[(4-fluorophenyl)methylene]bis(2-fluorophenol),
4,4'-methylenebis(2,6-difluorophenol),
4,4'-(4-fluorophenyl)methylenebis(2,6-difluorophenol),
2,6-bis[(2-hydroxy-5-fluorophenyl)methyl]-4-fluorophenol,
2,6-bis[(4-hydroxy-3-fluorophenyl)methyl]-4-fluorophenol, and
2,4-bis[(3-hydroxy-4-hydroxyphenyl)methyl]-6-methylphenol.

The acid labile groups are the same as formulae (5) to (7) described above.

Examples of useful hexafluoroisopropanol unit-containing compounds are given below, with the acid labile groups being the same as formulae (5) to (7) described above.

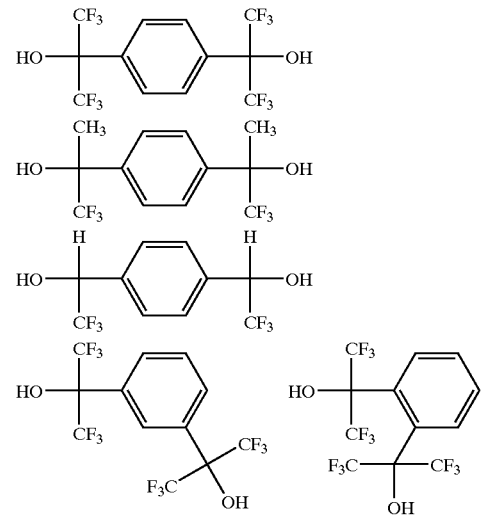

-continued

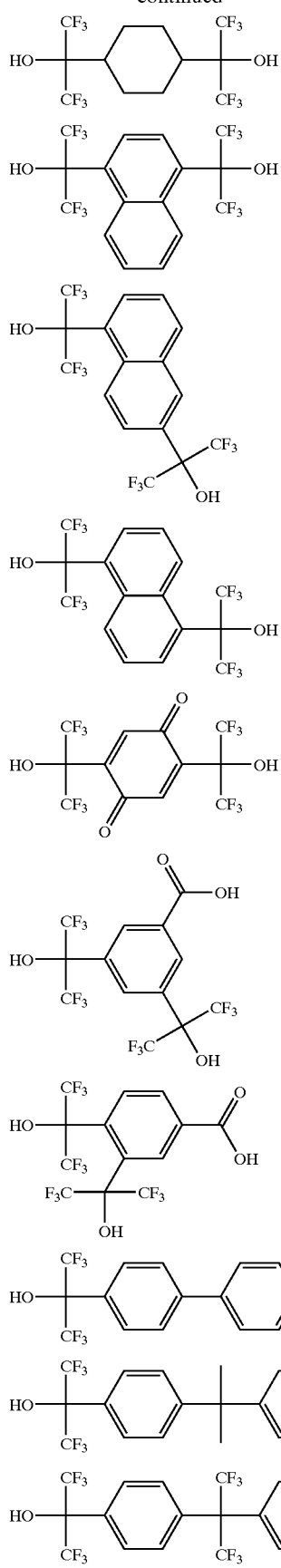

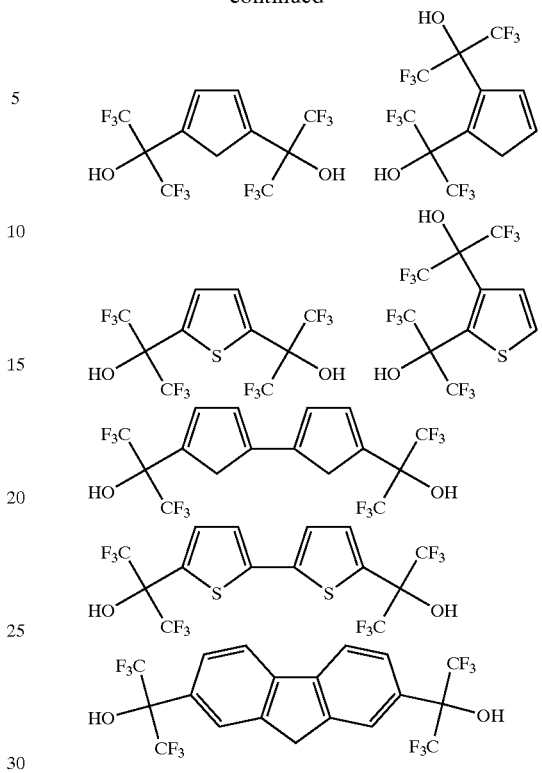

Illustrative, non-limiting, examples of the dissolution inhibitors which are useful herein include 3,3',5,5'-tetrafluoro[(1,1'-biphenyl)-4,4'-di-tbutoxycarbonyl],
4,4'-[2,2,2-trifluoro-1-(trifluoromethyl)ethylidene] bisphenol-4,4'-di-t-butoxycarbonyl,
bis(4-(2'-tetrahydropyranyloxy)phenyl)methane,
bis(4-(2'-tetrahydrofuranyloxy)phenyl)methane,
bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxy)phenyl)methane,
bis(4-(1'-ethoxypropyloxy)phenyl)methane,
2,2-bis(4'-(2"-tetrahydropyranyloxy))propane,
2,2-bis(4'-(2"-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4-tert-butoxycarbonylmethyloxyphenyl)propane,
2,2-bis(4'-(1"-ethoxyethoxy)phenyl)propane,
2,2-bis(4'-(1"-ethoxypropyloxy)phenyl)propane,
tert-butyl 4,4-bis(4'-(2"-tetrahydropyranyloxy)phenyl) valerate,
tert-butyl 4,4-bis(4'-(2"-tetrahydrofuranyloxy)phenyl) valerate,
tert-butyl 4,4-bis(4'-tert-butoxyphenyl)valerate,
tert-butyl 4,4-bis(4-tert-butoxycarbonyloxyphenyl)valerate,
tert-butyl 4,4-bis(4'-tert-butoxycarbonylmethyloxyphenyl) valerate,
tert-butyl 4,4-bis(4'-(1"-ethoxyethoxy)phenyl)valerate,
tert-butyl 4,4-bis(4'-(1"-ethoxypropyloxy)phenyl)valerate,
tris(4-(2'-tetrahydropyranyloxy)phenyl)methane,
tris(4-(2'-tetrahydrofuranyloxy)phenyl)methane,
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxy)phenyl)methane,
tris(4-(1'-ethoxypropyloxy)phenyl)methane, 1,1,2-tris(4'-(2"-tetrahydropyranyloxy)phenyl)ethane,
1,1,2-tris(4'-(2"-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,1,2-tris(4'-tert-butoxycarbonylmethyloxyphenyl)ethane,
1,1,2-tris(4'-(1'-ethoxyethoxy)phenyl)ethane,
1,1,2-tris(4'-(1'-ethoxypropyloxy)phenyl)ethane,
t-butyl 2-trifluoromethylbenzenecarboxylate,
t-butyl 2-trifluoromethylcyclohexanecarboxylate,
t-butyl decahydronaphthalene-2,6-dicarboxylate,
t-butyl cholate, t-butyl deoxycholate,
t-butyl adamantanecarboxylate, t-butyl adamantaneacetate, and
tetra-t-butyl 1,1'-bicyclohexyl-3,3',4,4'-tetracarboxylate.

In the resist composition according to the invention, an appropriate amount of the dissolution inhibitor (E) is up to about 20 parts, and especially up to about 15 parts by weight per 100 parts by weight of the base resin in the composition. With more than 20 parts of the dissolution inhibitor, the resist composition becomes less heat resistant because of an increased content of monomer components.

In general, resist compositions for $F_2$ lithography have the problem that the developer cannot effectively penetrate through the resist film because fluorine is incorporated in the base polymer. For resist compositions adapted for KrF and ArF exposure, methods of adding compounds containing water-soluble groups such as phenolic hydroxyl, carboxyl, sulfonamide and carbonamide groups were proposed to solve the problem of developer wettability. Examples include carboxylic anhydrides described in JP-A 2000-47385 and JP-A 2000-275840, phosphine compounds described in JP-A 2000-275838, thiocarbonyl group-containing compounds described in JP-A 2000-275841, carboxyl group-containing compounds described in JP-A 11-338150, and sulfonamide compounds described in JP-A 11-327145. However, all the foregoing compounds exhibit strong absorption at 157 nm and thus have the drawback of reducing the transmittance of resist compositions. It was thus proposed to use the hexafluoroisopropanol-containing compound described above in the dissolution inhibitor sector (whose hydroxyl group is not protected as opposed to the dissolution inhibitor) for the purpose of improving the developer wettability. The hexafluoroisopropanol-containing compound is preferably used in an amount of 5 to 40 parts, more preferably 8 to 30 parts by weight per 100 parts by weight of the polymer. Outside the range, less amounts may fail to achieve the desired effect whereas larger amounts may cause unexposed areas of the resist film to be dissolved after development and undergo phase separation from the polymer so that the film as spin coated becomes mottled.

The resist composition of the invention may include optional ingredients, typically a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, perfluoroalkyl EO-addition products, and fluorinated organosiloxane compounds. Illustrative examples include Florade FC-430 and FC-431 from Sumitomo 3M Ltd., Surflon S-141 and S-145 from Asahi Glass Co., Ltd., Unidyne DS-401, DS-403, and DS-451 from Daikin Industries Ltd., Megaface F-8151 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays, excimer laser beams, or x-rays in a dose of about 1 to 200 $mJ/cm^2$, and preferably about 10 to 100 $mJ/cm^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the inventive resist composition is suited to micro-pattern formation with, in particular, deep-UV rays having a wavelength of 254 to 120 nm, an excimer laser, especially ArF laser (193 nm), $F_2$ laser (157 nm), $Kr_2$ laser (146 nm), KrAr laser (134 nm) or $Ar_2$ laser (126 nm), x-rays, or an electron beam. The inventive resist composition is best suited for exposure to high-energy radiation in a wavelength band of 100 to 180 nm and 1 to 30 nm (e.g., $F_2$ laser, $Ar_2$ laser and soft-x-ray laser). The desired pattern may not be obtainable outside the upper and lower limits of the above range.

The resist composition according to the invention is sensitive to high-energy radiation, and has excellent sensitivity at a wavelength of up to 200 nm, especially up to 170 nm. Owing to the use of a sulfonate copolymer containing hydrophilic groups and fluorinated substituent groups as the base resin, the resist composition is more transparent, more adherent and more developer penetrable and at the same time, more resistant to plasma etching. These features of the inventive resist composition enable its use particularly as a resist having a low absorption at the exposure wavelength of a $F_2$ laser, and permit a finely defined pattern having sidewalls perpendicular to the substrate to be easily be formed, making the resist ideal as a micropatterning material in VLSI fabrication.

EXAMPLE

Examples of the invention are given below by way of illustration and not by way of limitation. The abbreviations used herein are AIBN for 2,2'-azobisisobutyronitrile, GPC for gel permeation chromatography, NMR for nuclear magnetic resonance, Mw for weight average molecular weight, and Mn for number average molecular weight.

Synthesis Example 1

Copolymerization of Monomer 1, Monomer 2 and Monomer 3 (20:40:40)

In a 300-ml flask, 7.00 g of Monomer 1, 7.58 g of Monomer 2 and 5.42 g of Monomer 3, all shown below, were dissolved in 5.0 g of 1,4-dioxane. The system was fully purged of oxygen, charged with 0.34 g of the initiator AIBN, and heated at 60° C. at which polymerization reaction took place for 24 hours.

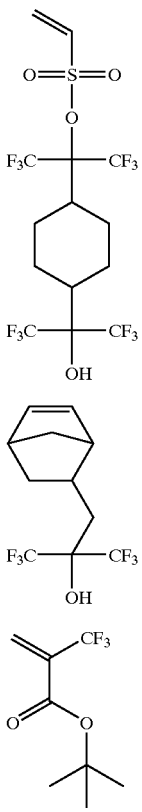

Monomer 1

Monomer 2

Monomer 3

The polymer thus obtained was worked up by pouring the reaction mixture into 1 liter of hexane whereupon the polymer precipitated. The polymer collected was dissolved in tetrahydrofuran and poured into 1 liter of hexane for precipitation. This cycle was repeated twice. The polymer was separated and dried. There was obtained 12.5 g of a white polymer, which was found to have a Mw of 5,100 as measured by the light scattering method, and a dispersity (Mw/Mn) of 1.4 as determined from the GPC elution curve. On $^1$H-NMR analysis, the polymer was found to consist of Monomer 1, Monomer 2 and Monomer 3 in a molar ratio of 16:43:41.

Synthesis Example 2
Copolymerization of Monomer 1, Monomer 2 and Monomer 4 (20:40:40)

In a 300-ml flask, 6.21 g of Monomer 1, 6.72 g of Monomer 2 and 7.07 g of Monomer 4, shown below, were dissolved in 5.0 g of 1,4-dioxane. The system was fully purged of oxygen, charged with 0.30 g of the initiator AIBN, and heated at 60° C. at which polymerization reaction took place for 24 hours.

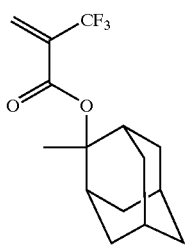

Monomer 4

The polymer thus obtained was worked up by pouring the reaction mixture into 1 liter of hexane whereupon the polymer precipitated. The polymer collected was dissolved in tetrahydrofuran and poured into 1 liter of hexane for precipitation. This cycle was repeated twice. The polymer was separated and dried. There was obtained 13.5 g of a white polymer, which was found to have a Mw of 5,200 as measured by the light scattering method, and a dispersity (Mw/Mn) of 1.4 as determined from the GPC elution curve. On $^1$H-NMR analysis, the polymer was found to consist of Monomer 1, Monomer 2 and Monomer 4 in a molar ratio of 17:42:41.

Synthesis Example 3
Copolymerization of Monomer 1, Monomer 5 and Monomer 3 (20:40:40)

In a 300-ml flask, 7.04 g of Monomer 1, 7.51 g of Monomer 5, shown below, and 5.45 g of Monomer 3 were dissolved in 5.0 g of 1,4-dioxane. The system was fully purged of oxygen, charged with 0.34 g of the initiator AIBN, and heated at 60° C. at which polymerization reaction took place for 24 hours.

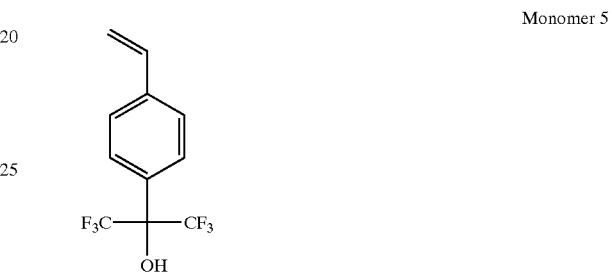

Monomer 5

The polymer thus obtained was worked up by pouring the reaction mixture into 1 liter of hexane whereupon the polymer precipitated. The polymer collected was dissolved in tetrahydrofuran and poured into 1 liter of hexane for precipitation. This cycle was repeated twice. The polymer was separated and dried. There was obtained 13.2 g of a white polymer, which was found to have a Mw of 9,300 as measured by the light scattering method, and a dispersity (Mw/Mn) of 1.6 as determined from the GPC elution curve. On $^1$H-NMR analysis, the polymer was found to consist of Monomer 1, Monomer 5 and Monomer 3 in a molar ratio of 20:42:38.

Synthesis Example 4
Copolymerization of Monomer 1, Monomer 5 and Monomer 4 (20:40:40)

In a 300-ml flask, 6.24 g of Monomer 1, 6.66 g of Monomer 5 and 7.10 g of Monomer 4 were dissolved in 5.0 g of 1,4-dioxane. The system was fully purged of oxygen, charged with 0.30 g of the initiator AIBN, and heated at 60° C. at which polymerization reaction took place for 24 hours.

The polymer thus obtained was worked up by pouring the reaction mixture into 1 liter of hexane whereupon the polymer precipitated. The polymer collected was dissolved in tetrahydrofuran and poured into 1 liter of hexane for precipitation. This cycle was repeated twice. The polymer was separated and dried. There was obtained 13.5 g of a white polymer, which was found to have a Mw of 9,900 as measured by the light scattering method, and a dispersity (Mw/Mn) of 1.6 as determined from the GPC elution curve. On $^1$H-NMR analysis, the polymer was found to consist of Monomer 1, Monomer 5 and Monomer 4 in a molar ratio of 19:41:40.

Synthesis Example 5
Copolymerization of Monomer 1, Monomer 6 and Monomer 3 (20:40:40)

In a 300-ml flask, 5.72 g of Monomer 1, 9.85 g of Monomer 6, shown below, and 4.43 g of Monomer 3 were dissolved in 5.0 g of 1,4-dioxane. The system was fully purged of oxygen, charged with 0.28 g of the initiator AIBN, and heated at 60° C. at which polymerization reaction took place for 24 hours.

Monomer 6

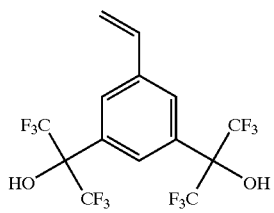

The polymer thus obtained was worked up by pouring the reaction mixture into 1 liter of hexane whereupon the polymer precipitated. The polymer collected was dissolved in tetrahydrofuran and poured into 1 liter of hexane for precipitation. This cycle was repeated twice. The polymer was separated and dried. There was obtained 13.6 g of a white polymer, which was found to have a Mw of 9,300 as measured by the light scattering method, and a dispersity (Mw/Mn) of 1.6 as determined from the GPC elution curve. On $^1$H-NMR analysis, the polymer was found to consist of Monomer 1, Monomer 6 and Monomer 3 in a molar ratio of 19:41:40.

Synthesis Example 6

Copolymerization of Monomer 1, Monomer 6 and Monomer 4 (20:40:40)

In a 300-ml flask, 5.18 g of Monomer 1, 8.92 g of Monomer 6 and 5.90 g of Monomer 4 were dissolved in 5.0 g of 1,4-dioxane. The system was fully purged of oxygen, charged with 0.25 g of the initiator AIBN, and heated at 60° C. at which polymerization reaction took place for 24 hours.

The polymer thus obtained was worked up by pouring the reaction mixture into 1 liter of hexane whereupon the polymer precipitated. The polymer collected was dissolved in tetrahydrofuran and poured into 1 liter of hexane for precipitation. This cycle was repeated twice. The polymer was separated and dried. There was obtained 13.2 g of a white polymer, which was found to have a Mw of 9,600 as measured by the light scattering method, and a dispersity (Mw/Mn) of 1.6 as determined from the GPC elution curve. On $^1$H-NMR analysis, the polymer was found to consist of Monomer 1, Monomer 6 and Monomer 4 in a molar ratio of 20:41:39.

Synthesis Example 7

Copolymerization of Monomer 7, Monomer 6 and Monomer 3 (20:40:40)

In a 300-ml flask, 5.67 g of Monomer 7, shown below, 9.89 g of Monomer 6 and 4.45 g of Monomer 3 were dissolved in 5.0 g of 1,4-dioxane. The system was fully purged of oxygen, charged with 0.28 g of the initiator AIBN, and heated at 60° C. at which polymerization reaction took place for 24 hours.

Monomer 7

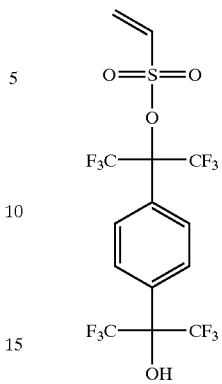

The polymer thus obtained was worked up by pouring the reaction mixture into 1 liter of hexane whereupon the polymer precipitated. The polymer collected was dissolved in tetrahydrofuran and poured into 1 liter of hexane for precipitation. This cycle was repeated twice. The polymer was separated and dried. There was obtained 13.2 g of a white polymer, which was found to have a Mw of 9,500 as measured by the light scattering method, and a dispersity (Mw/Mn) of 1.6 as determined from the GPC elution curve. On $^1$H-NMR analysis, the polymer was found to consist of Monomer 7, Monomer 6 and Monomer 3 in a molar ratio of 18:41:41.

Evaluation

Polymer Transmittance Measurement

The polymers obtained in Synthesis Examples 1 to 7, designated Polymers 1 to 7, respectively, were determined for transmittance. Three other polymers were furnished for comparison purposes. Comparative Polymer 1 is a monodisperse polyhydroxystyrene having a molecular weight of 10,000 and a dispersity (Mw/Mn) of 1.1 in which 30% of hydroxyl groups are replaced by tetrahydropyranyl groups. Similarly, Comparative Polymer 2 is polymethyl methacrylate having a molecular weight of 15,000 and a dispersity (Mw/Mn) of 1.7; and Comparative Polymer 3 is a novolac polymer having a meta/para ratio of 40/60, a molecular weight of 9,000 and a dispersity (Mw/Mn) of 2.5.

Each polymer, 1 g, was thoroughly dissolved in 20 g of propylene glycol monomethyl ether acetate (PGMEA), and passed through a 0.2-μm filter, obtaining a polymer solution. The polymer solution was spin coated onto a MgF$_2$ substrate and baked on a hot plate at 100° C. for 90 seconds, forming a polymer film of 100 nm thick on the substrate. Using a vacuum ultraviolet spectrometer (VUV-200S by Nihon Bunko K. K.), the polymer layer was measured for transmittance at 248 nm, 193 nm and 157 nm. The results are shown in Table 1.

TABLE 1

| | Transmittance (%) | | |
|---|---|---|---|
| | 248 nm | 193 nm | 157 nm |
| Polymer 1 | 99 | 93 | 69 |
| Polymer 2 | 99 | 93 | 65 |
| Polymer 3 | 99 | 10 | 60 |
| Polymer 4 | 99 | 10 | 57 |
| Polymer 5 | 99 | 11 | 66 |
| Polymer 6 | 99 | 11 | 60 |
| Polymer 7 | 99 | 11 | 55 |
| Comparative Polymer 1 | 90 | 5 | 15 |
| Comparative Polymer 2 | 91 | 80 | 12 |
| Comparative Polymer 3 | 82 | 6 | 17 |

It is evident from Table 1 that resist compositions using polymers within the scope of the invention have a high transparency at the $F_2$ laser wavelength of 157 nm.

Resist Preparation and Exposure

Resist solutions were prepared in a conventional manner by formulating the polymer, photoacid generator (PAG1 or PAG2), base, dissolution inhibitor (DRI1) and solvent in the amounts shown in Table 2.

PAG1

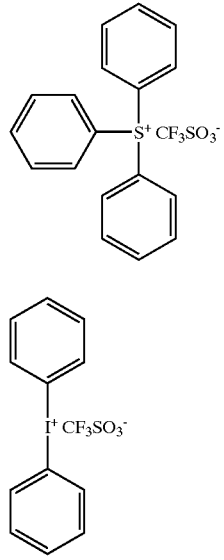

PAG2

DRI1

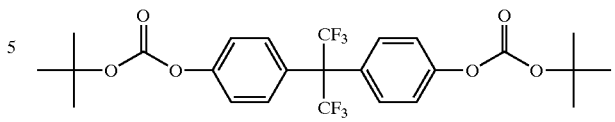

TBA: tributylamine

TEA: triethanolamine

PGMEA: propylene glycol monomethyl ether acetate

On silicon wafers having a film of DUV-30 (Brewer Science) coated to a thickness of 85 nm, the resist solutions were spin coated, then baked on a hot plate at 100° C. for 90 seconds to give resist films having a thickness of 200 nm.

The resist films were exposed by means of an $F_2$ laser (VUVES by Lithotec Japan Co., Ltd.) while varying the exposure dose. Immediately after exposure, the resist films were baked at 120° C. for 90 seconds and then developed for 60 seconds with a 2.38% aqueous solution of tetramethylammonium hydroxide. The film thickness was measured in different dose areas. From the residual film thickness-to-dose relationship, the sensitivity (Eth) was determined as the exposure dose giving a film thickness 0. A γ value which was the slope (tanθ) of the characteristic curve was also determined.

TABLE 2

| Polymer (pbw) | Photoacid generator (pbw) | Base (pbw) | Dissolution inhibitor (pbw) | Solvent (pbw) | Eth. mJ/cm² | γ |
|---|---|---|---|---|---|---|
| Polymer 1 (100) | PAG1 (4) | tributylamine (0.1) | — | PGMEA (1000) | 18 | 8.9 |
| Polymer 2 (100) | PAG1 (4) | tributylamine (0.1) | — | PGMEA (1000) | 10 | 10.5 |
| Polymer 3 (100) | PAG1 (4) | tributylamine (0.1) | — | PGMEA (1000) | 15 | 10.9 |
| Polymer 4 (100) | PAG1 (4) | tributylamine (0.1) | — | PGMEA (1000) | 6 | 11.3 |
| Polymer 5 (100) | PAG1 (4) | tributylamine (0.1) | — | PGMEA (1000) | 10 | 13.8 |
| Polymer 6 (100) | PAG1 (4) | tributylamine (0.1) | — | PGMEA (1000) | 5 | 16.5 |
| Polymer 7 (100) | PAG1 (4) | tributylamine (0.1) | — | PGMEA (1000) | 6 | 13.2 |
| Polymer 2 (100) | PAG1 (4) | triethanolamine (0.1) | — | PGMEA (1000) | 12 | 10.3 |
| Polymer 2 (100) | PAG1 (4) | tributylamine (0.1) | DRI1 (10) | PGMEA (1000) | 9 | 11.3 |
| Polymer 2 (100) | PAG2 (4) | tributylamine (0.1) | — | PGMEA (1000) | 7 | 12.9 |
| Comparative Polymer 1 (100) | PAG1 (4) | triethanolamine (0.1) | — | PGMEA (1000) | non-sensitive, turned negative without film thickness decreasing to 0 nm | — |

As is evident from Table 2, upon exposure to VUV, the resist compositions within the scope of the invention exerted the positive working effect that the film thickness decreased with an increasing exposure dose.

Japanese Patent Application No. 2002-233194 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist composition comprising a polymer of comprising recurring units of the general formula (1-1) or (1-2) and having a weight average molecular weight of 1,000 to 500,000,

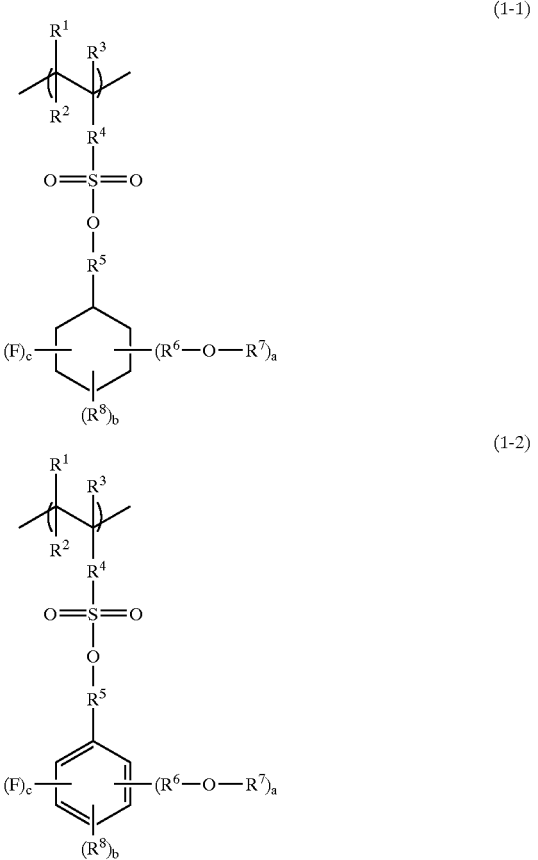

wherein $R^1$ to $R^3$ each are hydrogen, fluorine or a straight, branched or cyclic alkyl or fluorinated alkyl group of 1 to 40 carbon atoms, $R^4$ is a single bond or a straight, branched or cyclic alkylene or fluorinated alkylene group of 1 to 40 carbon atoms, $R^5$ is a single bond or a straight, branched or cyclic alkylene or fluorinated alkylene group of 1 to 40 carbon atoms, $R^6$ is a single bond or a straight, branched or cyclic alkylene or fluorinated alkylene group of 1 to 40 carbon atoms, $R^7$ is hydrogen or an acid labile group, $R^8$ is a straight, branched or cyclic fluorinated alkyl group of 1 to 40 carbon atoms, the subscript a is 1 or 2, b is an integer of 0 to 4, and c is an integer of 0 to 4, satisfying $1 \leq a+b+c \leq 4$.

2. A chemically amplified positive resist composition comprising (A) a polymer of comprising recurring units of the general formula (1-1) or (1-2) and having a weight average molecular weight of 1,000 to 500,000,

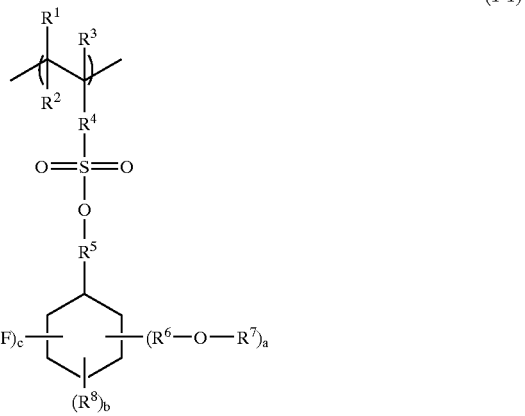

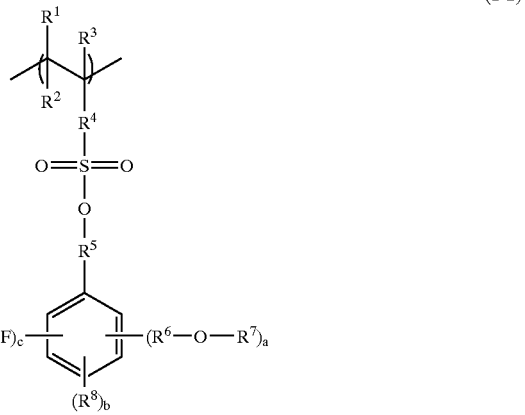

wherein $R^1$ to $R^3$ each are hydrogen, fluorine or a straight, branched or cyclic alkyl or fluorinated alkyl group of 1 to 40 carbon atoms, $R^4$ is a single bond or a straight, branched or cyclic alkylene or fluorinated alkylene group of 1 to 40 carbon atoms, $R^5$ is a single bond or a straight, branched or cyclic alkylene or fluorinated alkylene group of 1 to 40 carbon atoms, $R^6$ is a single bond or a straight, branched or cyclic alkylene or fluorinated alkylene group of 1 to 40 carbon atoms, $R^7$ is hydrogen or an acid labile group, $R^8$ is a straight, branched or cyclic fluorinated alkyl group of 1 to 40 carbon atoms, the subscript a is 1 or 2, b is an integer of 0 to 4, and c is an integer of 0 to 4, satisfying $1 \leq a+b+c \leq 4$, (B) an organic solvent, and (C) a photoacid generator.

3. The resist composition of claim 2, further comprising (D) a basic compound.

4. The resist composition of claim 2, further comprising (E) a dissolution inhibitor.

5. A process for forming a resist pattern comprising the steps of:

applying the resist, composition of claim 2 onto a substrate to form a coating, heat treating the coating and then exposing it to high-energy radiation in a wavelength band of 100 to 180 nm or 1 to 30 nm through a photomask, and optionally heat treating the exposed coating an developing it with a developer.

6. The pattern forming process of claim 5 wherein the high-energy radiation is an $F_2$ laser beam, $Ar_2$ laser beam or soft x-ray.

* * * * *